(12) United States Patent
Goto et al.

(10) Patent No.: US 11,852,482 B2
(45) Date of Patent: Dec. 26, 2023

(54) ANGULAR VELOCITY SENSOR AND ANGULAR VELOCITY SENSOR SYSTEM

(71) Applicant: DENSO CORPORATION, Kariya (JP)

(72) Inventors: Katsuaki Goto, Kariya (JP); Shota Harada, Kariya (JP); Takashi Katsumata, Kariya (JP); Yoshiyuki Hata, Kariya (JP); Teruhisa Akashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/730,752

(22) Filed: Apr. 27, 2022

(65) Prior Publication Data

US 2022/0252398 A1  Aug. 11, 2022

Related U.S. Application Data

(63) Continuation of application No. PCT/JP2020/040470, filed on Oct. 28, 2020.

(30) Foreign Application Priority Data

Oct. 29, 2019 (JP) .................... 2019-196694

(51) Int. Cl.
  *G01C 19/5726* (2012.01)
  *G01C 19/5762* (2012.01)
  *G01P 3/14* (2006.01)

(52) U.S. Cl.
  CPC ..... *G01C 19/5726* (2013.01); *G01C 19/5762* (2013.01); *G01P 3/14* (2013.01)

(58) Field of Classification Search
  CPC .................................... G01C 19/5726
  See application file for complete search history.

(56) References Cited

U.S. PATENT DOCUMENTS

| 5,969,225 | A  | * | 10/1999 | Kobayashi | ......... | G01C 19/5719 |
|-----------|----|---|---------|-----------|-----------|--------------|
|           |    |   |         |           |           | 73/1.37      |
| 8,763,460 | B2 | * | 7/2014  | Kim       | ........ | G01C 19/5755 |
|           |    |   |         |           |           | 73/504.12    |

(Continued)

FOREIGN PATENT DOCUMENTS

| JP | 2007-327944 A | 12/2007 |
|----|---------------|---------|
| JP | 2017-187445 A | 10/2017 |

OTHER PUBLICATIONS

Chang et al., "Automatic Mode Matching Control Loop Design and its application to the Mode Matched MEMS Gyroscope", Conference Proceedings, International Conference on Vehicular Electronics and Safety, IEEE 2007.

*Primary Examiner* — Paul M. West
*Assistant Examiner* — Mark A Shabman
(74) *Attorney, Agent, or Firm* — POSZ LAW GROUP, PLC

(57) ABSTRACT

A controller applies a predetermined voltage to a fixed part detection excitation electrode to vibrate a movable part in a second direction and simultaneously applies a predetermined voltage to a fixed part drive electrode to vibrate the movable part in a first direction. The controller acquires, of the movable part, a first resonance frequency along the first direction and a second resonance frequency along the second direction. The controller controls a drive spring adjustment part to adjust a spring constant of the drive spring, such that the first resonance frequency is maintained constant, and controls a detection spring adjustment part to adjust a spring constant of the detection spring such that the second resonance frequency is maintained constant. The controller detects the angular velocity based on a result of synchronously detecting signal from the fixed part detection electrode with the first resonance frequency.

13 Claims, 14 Drawing Sheets

(56) References Cited

U.S. PATENT DOCUMENTS

| | | |
|---|---|---|
| 2008/0000296 A1 | 1/2008 | Johnson |
| 2008/0236280 A1 | 10/2008 | Johnson et al. |
| 2015/0168437 A1* | 6/2015 | Jomori .................. G01P 3/14 |
| | | 73/496 |
| 2015/0369603 A1* | 12/2015 | Nakamura ......... G01C 19/5776 |
| | | 73/504.12 |
| 2018/0052012 A1* | 2/2018 | Nishizawa ............. G01D 3/028 |

* cited by examiner

ANGULAR VELOCITY SENSOR AND ANGULAR VELOCITY SENSOR SYSTEM

CROSS REFERENCE TO RELATED APPLICATION

The present application is a continuation application of International Patent Application No. PCT/JP2020/040470 filed on Oct. 28, 2020, which designated the U.S. and claims the benefit of priority from Japanese Patent Application No. 2019-196694 filed on Oct. 29, 2019. The entire disclosures of all of the above applications are incorporated herein by reference.

TECHNICAL FIELD

The present disclosure relates to an angular velocity sensor and an angular velocity sensor system that detect an angular velocity.

BACKGROUND

Conventionally, an angular velocity sensor that detects an angular velocity in a state where a mass part is driven and vibrated along a drive axis direction is known.

SUMMARY

According to an aspect of the present disclosure, an angular velocity sensor system is configured to detect an angular velocity. The angular velocity sensor system comprises an angular velocity sensor. The angular velocity sensor system further comprises a controller configured to execute predetermined processing.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
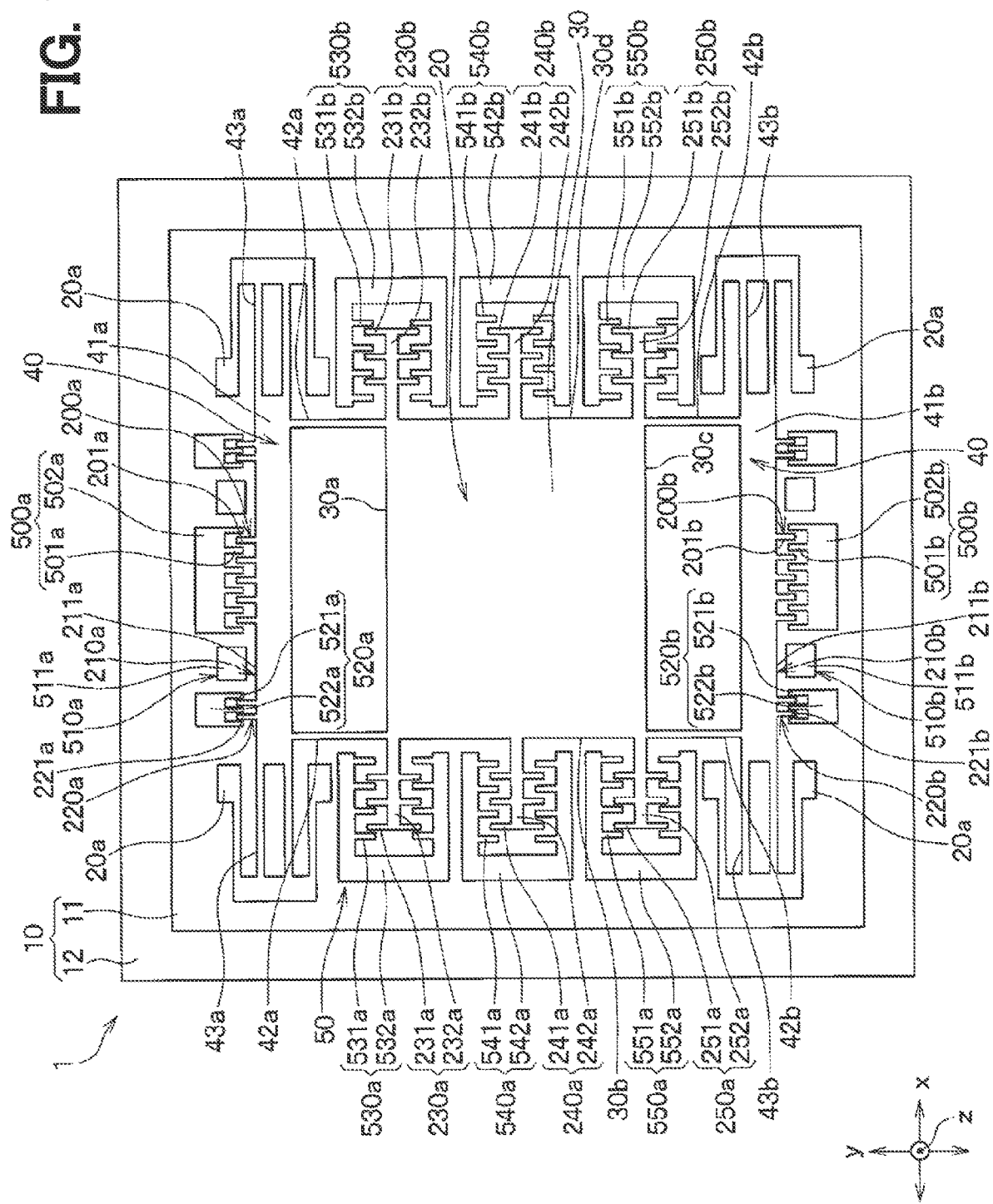
FIG. 1 is a plan view illustrating an angular velocity sensor according to a first embodiment.

Hereinafter, examples of the present disclosure will be described.

According to an example of the present disclosure, an angular velocity sensor detects an angular velocity in a state where a mass part is driven and vibrated along a drive axis direction. Specifically, in such an angular velocity sensor, the mass part vibrates in a detection axis direction orthogonal to the drive axis direction due to a Coriolis force, when an angular velocity is applied in the state where the mass part is driven and vibrated along the drive axis direction. Therefore, the angular velocity is detected on the basis of the vibration along the detection axis direction.

The angular velocity sensor is configured to be capable of switching between the drive axis direction and the detection axis direction. In this angular velocity sensor, a resonance frequency along the drive axis direction and a resonance frequency along the detection axis direction are acquired while, simultaneously, the drive axis direction and the detection axis direction are switched, and a sensitivity is corrected on the basis of a difference between these resonance frequencies. As a result, in this angular velocity sensor, a decrease in detection accuracy due to a disturbance, such as a temperature change or an impact, is suppressed.

In the angular velocity sensor, however, it is necessary to switch the drive axis direction, and a period, in which the angular velocity cannot be detected, is created every time the drive axis direction is switched. That is, in the angular velocity sensor, the period, in which the angular velocity cannot be detected, is created for each predetermined period, so that detection accuracy tends to be low.

In addition, the angular velocity sensor cannot cope with a change in the resonance frequency along the detection axis direction while, simultaneously, it is being driven and vibrated along the drive axis direction. As a result, a decrease in detection accuracy cannot be sufficiently suppressed. Furthermore, since the sensitivity of the angular velocity sensor depends on the resonance frequency along the drive axis direction, a variation in the sensitivity due to a variation in the absolute value of the resonance frequency cannot be sufficiently suppressed when the sensitivity is corrected on the basis of a difference between the resonance frequency along the drive axis direction and the resonance frequency along the detection axis direction. As a result, detection accuracy decreases.

According to an example of the present disclosure, an angular velocity sensor system is configured to detect an angular velocity.

The angular velocity sensor system comprises an angular velocity sensor. The angular velocity sensor system further comprises a controller configured to execute predetermined processing.

The angular velocity sensor includes a movable part and a fixed part.

The movable part includes a drive spring, a detection spring, a mass part supported via the drive spring and the detection spring, configured to vibrate in a first direction by deformation of the drive spring, and configured to vibrate in a second direction orthogonal to the first direction by deformation of the detection spring due to a Coriolis force when an angular velocity is applied while vibrating in the first direction, a movable part drive electrode, a movable part detection electrode, and a movable part detection excitation electrode, The fixed part includes a fixed part drive electrode facing the movable part drive electrode, a fixed part detection electrode facing the movable part detection electrode, and a fixed part detection excitation electrode facing the movable part detection excitation electrode.

The angular velocity sensor includes a drive spring adjustment part configured to change a spring constant of the drive spring, and a detection spring adjustment part configured to change a spring constant of the detection spring.

The controller is configured to vibrate the movable part in the second direction by applying a predetermined voltage to the fixed part detection excitation electrode and simultaneously vibrate the movable part in the first direction by applying a predetermined voltage to the fixed part drive electrode, acquire a first resonance frequency of the movable part, which is in a direction along the first direction, and a second resonance frequency of the movable part, which is in a direction along the second direction, adjust the spring constant of the drive spring by controlling the drive spring adjustment part, such that the first resonance frequency is maintained at a constant value, adjust the spring constant of the detection spring by controlling the detection spring adjustment part, such that the second resonance frequency is maintained at a constant value, and detect the angular velocity on a basis of a result of synchronously detecting a signal from the fixed part detection electrode with the first resonance frequency.

According to this, a controller is configured to maintains a first resonance frequency at a constant value and maintains a second resonance frequency at a constant value, while vibrating a movable part in a first direction and a second direction. Therefore, an influence of a disturbance, such as a temperature change or an impact, can be reduced, and a decrease in detection accuracy can be suppressed.

In addition, the controller is configured to maintain the first resonance frequency at a constant value and maintain the second resonance frequency at a constant value, while vibrating the movable part in the first direction and the second direction, so that it is not necessary to switch between the first direction and the second direction. Therefore, it is not necessary to intermittently vibrate the movable part, so that a period, in which the angular velocity cannot be detected, is not created. Therefore, a decrease in detection accuracy can be further suppressed.

According to an example of the present disclosure, an angular velocity sensor is configured to detect an angular velocity. The angular velocity sensor comprises a movable part, a fixed part, a drive spring adjustment part, and a detection spring adjustment part.

The movable part includes a drive spring, a detection spring, a mass part, which is supported via the drive spring and the detection spring, configured to vibrate in a first direction by deformation of the drive spring, and configured to vibrate in a second direction orthogonal to the first direction by deformation of the detection spring due to a Coriolis force when an angular velocity is applied while vibrating in the first direction, a movable part drive electrode, a movable part detection electrode, and a movable part detection excitation electrode.

The fixed part includes a fixed part drive electrode facing the movable part drive electrode, a fixed part detection electrode facing the movable part detection electrode, and a fixed part detection excitation electrode facing the movable part detection excitation electrode.

The drive spring adjustment part is configured to change a spring constant of the drive spring. The detection spring adjustment part is configured to change a spring constant of the detection spring.

The movable part is configured to vibrate in the second direction when a predetermined voltage is applied to the fixed part detection excitation electrode and simultaneously vibrate in the first direction when a predetermined voltage is applied to the fixed part drive electrode.

The spring constant of the drive spring is configured to be adjusted by controlling the drive spring adjustment part, such that a first resonance frequency of the movable part in a direction along the first direction is maintained at a constant value.

The spring constant of the detection spring is configured to be adjusted by controlling the detection spring adjustment part, such that a second resonance frequency of the movable part in a direction along the second direction is maintained at a constant value.

The angular velocity is configured to be detected on a basis of a signal from the fixed part detection electrode.

According to this, the first resonance frequency is maintained and the second resonance frequency is maintained, while the movable part is caused to be in a state of vibrating in the first direction and the second direction. Therefore, an influence of a disturbance, such as a temperature change or an impact, can be reduced, and a decrease in detection accuracy can be suppressed.

In addition, the first resonance frequency is maintained and the second resonance frequency is maintained, while the movable part is caused to be in a state of vibrating in the first direction and the second direction, so that it is not necessary to switch between the first direction and the second direction. Therefore, it is not necessary to intermittently vibrate the movable part, so that a period, in which the angular velocity cannot be detected, is not created. Therefore, a decrease in detection accuracy can be further suppressed.

Hereinafter, embodiments of the present disclosure will be described with reference to the drawings. In the following embodiments, the same or equivalent portions will be denoted by the same reference numerals and described.

First Embodiment

A first embodiment will be described with reference to the drawings. Note that an angular velocity sensor 1 of the present embodiment is preferably mounted, for example, on a vehicle in order to be used for detecting an angular velocity around an axis parallel to a vertical direction of the vehicle.

As illustrated in FIG. 1, the angular velocity sensor 1 is formed on one surface side of a plate-shaped substrate 10. In the present embodiment, the substrate 10 is formed by using a silicon on insulator (SOI) substrate in which a support substrate 11, a non-illustrated embedded insulating film, and a semiconductor layer 12 are sequentially laminated. Each pattern constituting a sensor structure in the angular velocity sensor 1 is in a released state in which the embedded insulating film is partially removed.

The following description will be made assuming that one direction in a plane direction of the semiconductor layer 12 is as an x-axis direction, a direction orthogonal to the x-axis direction is a y-axis direction, and a direction orthogonal to the x-axis direction and the y-axis direction is a z-axis direction. In FIG. 1, a horizontal direction on the paper is defined as the x-axis direction, a vertical direction on the paper as the y-axis direction, and a direction perpendicular to the paper as the z-axis direction.

The angular velocity sensor 1 is configured to include a movable part 20, a fixed part 50, and the like. The movable part 20 is caused to be in a state of being released from the support substrate 11, in a portion excluding anchor parts 20a to be described later, the embedded insulation film to be located on a back surface side is removed. The fixed part 50 is caused to be in a state in which the embedded insulation film is left in at least a part on the back surface side and the at least a part is fixed to the support substrate 11 without being released from the support substrate 11. Although not particularly illustrated, pads are formed at predetermined positions of the movable part 20 and the fixed part 50, so that the movable part 20 and the fixed part 50 are electrically connected, via the pads, to a control unit (controller) 600 to be described later.

Hereinafter, configurations of the movable part 20 and the fixed part 50 will be specifically described. The movable part 20 is configured to include a mass part 30, a beam part 40, and various electrode parts 200a, 200b, 210a, 210b, 220a, 220b, 230a, 230b, 240a, 240b, 250a, and 250b.

The mass part 30 is a portion that is displaced according to an applied angular velocity, and is supported by the anchor parts 20a via the beam parts 40. In the present embodiment, the mass part 30 is made to have a substantially rectangular planar shape having a pair of sides 30a and 30c along the x-axis direction and a pair of sides 30b and 30d along the y-axis direction.

The beam part 40 supports the mass part 30 and is configured to be able to displace the mass part 30 in the x-axis direction and the y-axis direction when the angular velocity is detected. In the present embodiment, the beam part 40 is configured to include plates 41a and 41b, detection springs 42a and 42b, and drive springs 43a and 43b.

The plates 41a and 41b each have a rectangular planar shape in which a length in the y-axis direction is smaller than that of the mass part 30. They are placed to face the sides 30a and 30c across the mass part 30, respectively. That is, the respective plates 41a and 41b are placed across the mass part 30.

The detection springs 42a and 42b are placed to couple the mass part 30 with the plates 41a and 41b, respectively. In the present embodiment, the detection springs 42a and 42b are provided to connect both ends of each of the sides 30a and 30c, along the x-axis direction, of the mass part 30 to the plates 41a and 41b, respectively. Note that the detection springs 42a and 42b of the present embodiment are each configured to have a straight beam structure.

The drive springs 43a and 43b are placed to couple the sides, along the y-axis direction, of each of the plates 41a and 41b with the anchor parts 20a, respectively. That is, the plates 41a and 41b are supported by the anchor parts 20a with two drive springs 43a and two drive springs 43b, respectively. As a result, the mass part 30 is in a state of being supported by the anchor parts 20a via the drive springs 43a and 43b, the plates 41a and 41b, and the detection springs 42a and 42b. Note that the drive springs 43a and 43b of the present embodiment are each configured to have a structure that is more easily bent linearly than the detection springs 42a and 42b, and configured to have a folded beam structure.

The various electrode parts 200a, 200b, 210a, 210b, 220a, 220b, 230a, 230b, 240a, 240b, 250a, and 250b include movable part drive electrode parts 200a and 200b, movable part drive adjustment electrode parts 210a and 210b, movable part drive monitor electrode parts 220a and 220b, movable part detection electrode parts 230a and 230b, movable part detection adjustment electrode parts 240a and 240b, and movable part detection excitation electrode parts 250a and 250b.

The movable part drive electrode parts 200a and 200b, the movable part drive adjustment electrode parts 210a and 210b, and the movable part drive monitor electrode parts 220a and 220b are provided in the plates 41a and 41b, respectively.

Specifically, the movable part drive electrode parts 200a and 200b are configured to include movable part drive electrodes 201a and 201b protruding in a comb shape on an opposite side to the mass part 30 side at substantially central portions, in the x-axis direction, of the plates 41a and 41b, respectively.

Two movable part drive adjustment electrode parts 210a and two movable part drive adjustment electrode parts 210b are provided to sandwich the movable part drive electrode parts 200a and 200b, respectively. Portions of the movable part drive adjustment electrode parts 210a and 210b, facing fixed part drive adjustment electrodes 511a and 511b to be described later, are formed as movable part drive adjustment electrodes 211a and 211b, respectively.

Two movable part drive monitor electrode parts 220a and two movable part drive monitor electrode parts 220b are provided to sandwich the movable part drive electrodes 201a and 201b and the movable part drive adjustment electrodes 211a and 211b, respectively. The movable part drive monitor electrode parts 220a and 220b are configured to include movable part drive monitor electrodes 221a and 221b protruding in a comb shape on the opposite side to the mass part 30 side, respectively.

The movable part detection electrode parts 230a and 230b, the movable part detection adjustment electrode parts 240a and 240b, and the movable part detection excitation electrode parts 250a and 250b are provided on the sides 30b and 30d, along the y-axis direction, of the mass part 30, respectively. That is, the movable part detection electrode parts 230a and 230b, the movable part detection adjustment electrode parts 240a and 240b, and the movable part detection excitation electrode parts 250a and 250b are respectively formed to be located on both sides between which the mass part 30 is sandwiched.

The movable part detection electrode parts 230a and 230b are configured to include movable part detection electrodes 231a and 231b and support parts 232a and 232b that support the movable part detection electrodes 231a and 231b, respectively. The support parts 232a and 232b are each formed to protrude from the mass part 30 along the x-axis direction. The movable part detection electrodes 231a and 231b are provided in the support parts 232a and 232b so as to be extended from the support parts 232a and 232b along the y-axis direction, respectively.

The movable part detection adjustment electrode parts 240a and 240b are configured to include movable part detection adjustment electrodes 241a and 241b and support parts 242a and 242b that support the movable part detection adjustment electrodes 241a and 241b, respectively. The support parts 242a and 242b are each formed to protrude from the mass part 30 along the x-axis direction. The movable part detection adjustment electrodes 241a and 241b are provided in the support parts 242a and 242b so as to be extended from the support parts 242a and 242b along the y-axis direction, respectively.

The movable part detection adjustment electrode parts 250a and 250b are configured to include movable part detection excitation electrodes 251a and 251b and support parts 252a and 252b that support the movable part detection excitation electrodes 251a and 251b, respectively. The support parts 252a and 252b are each formed to protrude from the mass part 30 along the x-axis direction. The movable part detection excitation electrodes 251a and 251b are provided in the support parts 252a and 252b so as to be extended from the support parts 252a and 252b along the y-axis direction, respectively.

Note that the movable part detection electrodes 231a and 231b, the movable part detection adjustment electrodes 241a and 241b, and the movable part detection excitation electrodes 251a and 251b are extended on both sides of the support parts 232a, 232b, 242a, 242b, 252a, and 252b, respectively.

The configuration of the movable part 20 according to the present embodiment has been described above. Although specifically described later, the movable part 20 of the present embodiment is caused to perform self-excited resonance along the y-axis direction and to perform self-excited resonance along the x-axis direction, when the angular velocity is detected. In the present embodiment, "the movable part 20 performs self-excited resonance along the y-axis direction" is also referred to as "the movable part 20 performs drive resonance", and "the movable part 20 performs self-excited resonance along the x-axis direction" is also referred to as "the movable part 20 performs detection resonance". In the present embodiment, the y-axis direction serves as the drive axis direction and corresponds to the first direction. Similarly, the x-axis direction serves as the detection axis direction and corresponds to the second direction.

Figure 2:
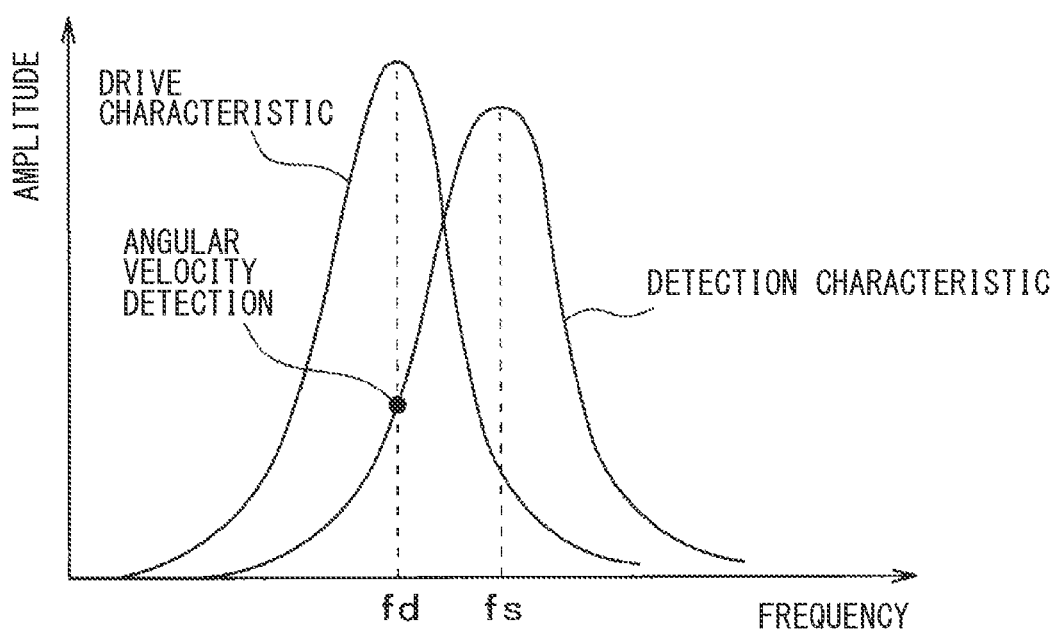
FIG. 2 is a graph showing a relationship between a drive characteristic and a detection characteristic of a movable part.

In the following description, a resonance frequency in a direction along the y-axis direction, at which the movable part 20 performs drive resonance, is defined as a drive resonance frequency fd, and a resonance frequency in a direction along the x-axis direction, at which the movable part 20 performs detection resonance, is defined as a detection resonance frequency fs, as illustrated in FIG. 2. In FIG. 2, a relationship between the frequency and the amplitude related to the vibration, along the y-axis direction, of the movable part 20 is shown as a drive characteristic, and a relationship between the frequency and the amplitude related to the vibration, along the x-axis direction, of the movable part 20 is shown as a detection characteristic. In the present embodiment, the drive resonance frequency fd corresponds to the first resonance frequency, and the detection resonance frequency fs corresponds to the second resonance frequency. Furthermore, the drive resonance frequency fd and the detection resonance frequency fs are set to different values in the present embodiment.

As illustrated in FIG. 1, the fixed part 50 includes fixed part drive electrode parts 500a and 500b, fixed part drive adjustment electrode parts 510a and 510b, fixed part drive monitor electrode parts 520a and 520b, fixed part detection electrode parts 530a and 530b, fixed part detection adjustment electrode parts 540a and 540b, and fixed part detection excitation electrode parts 550a and 550b.

The fixed part drive electrode parts 500a and 500b are configured to include comb-shaped fixed part drive electrodes 501a and 501b extended in the y-axis direction so as to mesh with the comb teeth of the movable part drive electrodes 201a and 201b, and support parts 502a and 502b that support the fixed part drive electrodes 501a and 501b, respectively.

The fixed part drive adjustment electrode parts 510a and 510b are placed to face the plates 41a and 41b, respectively. In the present embodiment, the fixed part drive adjustment electrode parts 510a and 510b are configured to include fixed part drive adjustment electrodes 511a and 511b having a substantially rectangular planar shape, respectively. Two fixed part drive adjustment electrode parts 510a and two fixed part drive adjustment electrode parts 510b are placed at positions spaced apart from the plate 41a and 41b by predetermined intervals, in order to sandwich the fixed part drive electrode parts 500a and 500b, respectively. As described above, portions of the plates 41a and 41b, facing the fixed part drive adjustment electrodes 511a and 511b, serve as the movable part drive adjustment electrodes 211a and 211b, respectively.

The fixed part drive monitor electrode parts 520a and 520b are configured to include fixed part drive monitor electrodes 521a and 521b extended in the y-axis direction so as to mesh with the comb teeth of the movable part drive monitor electrodes 221a and 221b, and support parts 522a and 522b that support the fixed part drive monitor electrodes 521a and 521b, respectively.

The fixed part detection electrode part 530a and 530b are configured to include fixed part detection electrodes 531a and 531b extended in the y-axis direction so as to mesh with the comb teeth of the movable part detection electrodes 231a and 231b, and support parts 532a and 532b that support the fixed part detection electrodes 531a and 531b, respectively.

The fixed part detection adjustment electrode parts 540a and 540b are configured to include fixed part detection adjustment electrodes 541a and 541b extended in the y-axis direction so as to mesh with the comb teeth of the movable part detection adjustment electrodes 241a and 241b, and support parts 542a and 542b that support the fixed part detection adjustment electrodes 541a and 541b, respectively.

The fixed part detection excitation electrode parts 550a and 550b are configured to include fixed part detection excitation electrodes 551a and 551b extended in the y-axis direction so as to mesh with the comb teeth of the movable part detection excitation electrodes 251a and 251b, and support parts 552a and 552b that support the fixed part detection excitation electrodes 551a and 551b, respectively.

Note that the movable part detection adjustment electrodes 241a and 241b and the fixed part detection adjustment electrodes 541a and 541b are formed such that the intervals between the adjacent electrodes 241a and 241b and between the adjacent electrodes 541a and 541b are equal. That is, the movable part detection adjustment electrodes 241a and 241b are formed at the centers of the fixed part detection adjustment electrodes 541a and 541b adjacent to each other along the x-axis direction, respectively.

On the other hand, the movable part detection electrodes 231a and 231b and fixed part detection electrodes 531a and 531b are formed such that intervals between the adjacent electrodes 231a and 231b and between the adjacent electrodes 531a and 531b are different. In the present embodiment, the movable part detection electrodes 231a and 231b and the fixed part detection electrodes 531a and 531b are formed such that the intervals between the fixed part detection electrodes 531a and 531b, adjacent to each other along the x-axis direction, and the movable part detection electrodes 231a and 231b, placed between the fixed part detection electrodes 531a and 531b, are set to be as follows. That is, the movable part detection electrodes 231a and 231b and the fixed part detection electrodes 531a and 531b are formed such that the intervals between the fixed part detection electrodes 531a and 531b and the movable part detection electrodes 231a and 231b on the mass part 30 side are larger than the intervals between the fixed part detection electrodes 531a and 531b and the movable part detection electrodes 231a and 231b on the opposite side to the mass part 30 side.

Similarly, the movable part detection excitation electrodes 251a and 251b and the fixed part detection excitation electrodes 551a and 551b are formed such that intervals between the adjacent electrodes 251a and 251b and between the adjacent electrodes 551a and 551b are different. In the present embodiment, the movable part detection excitation electrodes 251a and 251b and the fixed part detection excitation electrodes 551a and 551b are formed such that the intervals between the fixed part detection excitation electrodes 551a and 551b, adjacent to each other along the x-axis direction, and the movable part detection excitation electrodes 251a and 251b, placed between the fixed part detection excitation electrodes 551a and 551b, are set to be as follows. That is, the movable part detection excitation electrodes 251a and 251b and the fixed part detection excitation electrodes 551a and 551b are formed such that the intervals between the fixed part detection excitation electrodes 551a and 551b and the movable part detection excitation electrodes 251a and 251b on the mass part 30 side are larger than the intervals between the fixed part detection excitation electrodes 551a and 551b and the movable part detection excitation electrodes 251a and 251b on the opposite side to the mass part 30 side.

Figure 3:
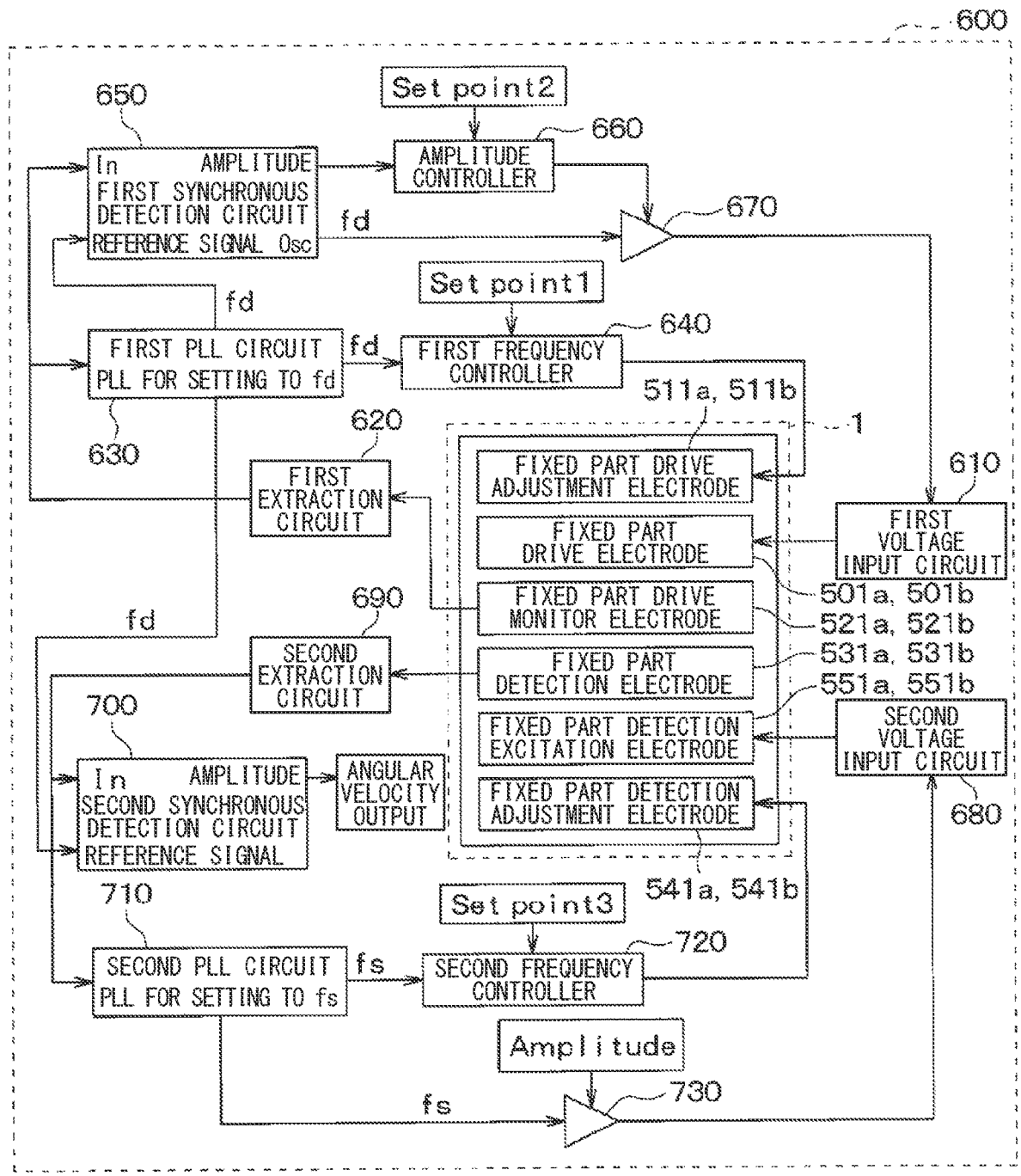
FIG. 3 is a block diagram illustrating an angular velocity sensor system including the angular velocity sensor illustrated in FIG. 1.

The configuration of the angular velocity sensor 1 according to the present embodiment has been described above. Note that in the present embodiment, the movable part drive adjustment electrodes 211a and 211b and the fixed part drive adjustment electrodes 511a and 511b correspond to drive spring adjustment parts, respectively. The movable part detection adjustment electrodes 241a and 241b and the fixed part detection adjustment electrodes 541a and 541b correspond to detection spring adjustment parts, respectively. Next, an angular velocity sensor system using the angular velocity sensor 1 will be described with reference to FIG. 3. In FIG. 3, fd and fs indicate frequencies.

The angular velocity sensor system is configured to include the angular velocity sensor 1 and the control unit 600 including various circuits. Note that in a case where the angular velocity sensor system is mounted on a vehicle, the control unit 600 includes a vehicle electronic control unit (ECU) and the like. Although not particularly illustrated, the movable part 20 is connected, for example, to the ground of the control unit 600 to be maintained at a ground potential.

The control unit 600 includes a first voltage input circuit 610, a first extraction circuit 620, a first phase synchronous circuit (hereinafter, also simply referred to as a first phase-locked loop (PLL) circuit) 630, a first frequency controller 640, a first synchronous detection circuit 650, an amplitude controller 660, a first integrator 670, and the like. In addition, the control unit 600 includes a second voltage input circuit 680, a second extraction circuit 690, a second synchronous detection circuit 700, a second phase synchronous circuit (hereinafter, also referred to as a second PLL circuit) 710, a second frequency controller 720, a second integrator 730, and the like.

The first voltage input circuit 610 is configured to include a bias addition circuit, a phase inversion circuit, a non-inversion circuit, and the like, and is connected to the respective fixed part drive electrodes 501a and 501b. The first voltage input circuit 610 generates two types of signals: a signal whose phase is inverted by 180° and a non-inverted signal, while adding a predetermined bias to the input signal. Then, the first voltage input circuit 610 inputs the inverted signal to one of the fixed part drive electrodes 501a and 501b, and inputs the non-inverted signal to the other. As will be described later, the first voltage input circuit 610 inputs an AC voltage having a frequency fd to the fixed part drive electrodes 501a and 501b. As will be described later, the movable part 20 is controlled such that the drive resonance frequency is maintained at fd. Therefore, the movable part 20 performs drive resonance along the y-axis direction.

The first extraction circuit 620 is configured to include a C-V conversion circuit, a differential amplifier circuit, and the like, and is connected to the respective fixed part drive monitor electrodes 521a and 521b. The first extraction circuit 620 acquires and differentially amplifies the signals output from the respective fixed part drive monitor electrodes 521a and 521b, and outputs signals converted into voltages.

The first PLL circuit 630 is connected to the first extraction circuit 620, and outputs the signal input from the first extraction circuit 620 such that the frequency of the signal becomes fd. In this case, the first PLL circuit 630 controls the frequency such that a phase difference between the input signal and the output signal becomes the phase difference (e.g., 90° at resonance.

The first frequency controller 640 is connected to the first PLL circuit 630 and the fixed part drive adjustment electrodes 511a and 511b, is configured to include, for example, a frequency counter and the like, and quantifies the frequency of the signal output from the first PLL circuit 630. Then, the first frequency controller 640 applies a DC voltage to the fixed part drive adjustment electrodes 511a and 511b such that the quantified frequency becomes a desired drive resonance frequency (i.e., Set point1 in FIG. 3). As a result, an electric spring effect is generated, the electric spring effect corresponding to a potential difference between the movable part 20 (i.e., the movable part drive adjustment electrodes 211a and 211b) and the fixed part drive adjustment electrodes 511a and 511b placed to sandwich the movable part 20. In the angular velocity sensor 1, spring constants of the drive springs 43a and 43b are adjusted by the electric spring effect, so that the drive resonance frequency of the movable part 20 is maintained at the desired fd. That is, even if a disturbance, such as a temperature change or an impact, is applied to the angular velocity sensor 1, the drive resonance frequency of the movable part 20 is maintained at the desired fd.

The first synchronous detection circuit 650 is connected to the first extraction circuit 620 and the first PLL circuit 630, and synchronously detects the signal output from the first extraction circuit 620 using the signal output from the first PLL circuit 630 as a reference signal. Then, the first synchronous detection circuit 650 outputs an amplitude amount of the same frequency component as the reference signal to the amplitude controller 660, and outputs a signal having a frequency of fd to the first integrator 670.

The amplitude controller 660 is connected to the first synchronous detection circuit 650. When the amplitude amount is input from first synchronous detection circuit 650, the amplitude controller 660 adjusts a voltage value of an AC voltage to be applied to the fixed part drive electrodes 501a and 501b so as to obtain a desired amplitude amount of the drive resonance (i.e., Set point2 in FIG. 3). The amplitude controller 660 outputs the amplitude amount to the first integrator 670. As a result, an AC voltage, having the controlled voltage value and the frequency fd, is input to the fixed part drive electrodes 501a and 501b via the first integrator 670 and the first voltage input circuit 610. Therefore, the movable part 20 performs, along the y-axis direction, drive resonance with a constant amplitude. The second voltage input circuit 680 is configured to include a bias addition circuit, a phase inversion circuit, a non-inversion circuit, and the like, and is connected to the respective fixed part detection excitation electrodes 551a and 551b. The second voltage input circuit 680 generates two types of signals: a signal whose phase is inverted and a non-inverted signal, while adding a predetermined bias to the input signal. Then, the second voltage input circuit 680 inputs the inverted signal to one of the fixed part detection excitation electrodes 551a and 551b and inputs the non-inverted signal to the other. As will be described later, the second voltage input circuit 680 inputs an AC voltage having a frequency fs to the fixed part detection excitation electrodes 551a and 551b. As will be described later, the movable part 20 is also controlled such that the detection resonance frequency is maintained at fs. Therefore, the movable part 20 performs detection resonance along the x-axis direction.

The second extraction circuit 690 is configured to include a C-V conversion circuit, a differential amplifier circuit, and the like, and is connected to the respective fixed part detection electrodes 531a and 531b. The second extraction circuit 690 acquires and differentially amplifies the signals output from the respective fixed part detection electrodes 531a and 531b, and outputs signals converted into voltages.

Note that the signal output from each of the fixed part detection electrodes 531a and 531b becomes a signal obtained by superimposing a signal caused by the detection resonance and a signal caused by the vibration due to a Coriolis force generated when the angular velocity is applied.

The second synchronous detection circuit 700 is connected to the second extraction circuit 690 and the first PLL circuit 630, and synchronously detects the signal output from the second extraction circuit 690 using the signal (i.e., the signal having the drive resonance frequency fd) output from the first PLL circuit 630 as a reference signal. In addition, the second synchronous detection circuit 700 of the present embodiment includes a low-pass filter (hereinafter, also simply referred to as the LPF), removes an AC component of the signal that has been synchronously detected by the LPF, and outputs a DC component. That is, the second synchronous detection circuit 700 outputs an amplitude amount of the same frequency component as the reference signal, while reducing an influence of the detection resonance by the LPF. As a result, the angular velocity is detected based on the result of the synchronous detection at the drive resonance frequency fd. In the LPF of the present embodiment, frequencies equal to or larger than the absolute value (i.e, |fs−fd|) of the difference between the drive resonance frequency fd and the detection resonance frequency fs are removed.

That is, assuming that the signal caused by the detection resonance is S·sin ωst, the signal caused by the vibration due to the Coriolis force is C (Ω)·cos ωdt, the reference signal is cos ωdt, ωd=2πfd, and ωs=2πfs, the signal that has been synchronously detected by the second synchronous detection circuit 700 is expressed by the following equation.

$$(C(\Omega)\cos\omega_D t + S\sin\omega_S t + \cdots) \times \cos\omega_D t = \frac{C(\Omega)}{2} + \quad \text{[Equation 1]}$$
$$\frac{C(\Omega)}{2}\cos 2\omega_D t + \frac{S}{2}\sin(\omega_D + \omega_S)t - \frac{S}{2}\sin(\omega_D - \omega_S)t + \cdots$$

Therefore, the amplitude (i.e., the angular velocity) of the vibration caused by the Coriolis force can be suitably detected by removing the frequencies equal to or larger than |fs−fd| by the LPF.

The second PLL circuit 710 is connected to the second extraction circuit 690, and outputs the signal input from the second extraction circuit 690 such that the frequency of the signal becomes fs. In this case, the second PLL circuit 710 controls the frequency such that the phase difference between the input signal and the output signal becomes the phase difference (e.g., 90°) at resonance.

The second frequency controller 720 is connected to the second PLL circuit 710 and the fixed part detection adjustment electrodes 541a and 541b, is configured to include, for example, a frequency counter and the like, and quantifies the frequency of the signal output from the second PLL circuit 710. Then, the second frequency controller 720 applies a DC voltage to the fixed part detection adjustment electrodes 541a and 541b such that the quantified frequency becomes a desired detection resonance frequency (i.e., Set point3 in the view). As a result, an electric spring effect is generated between the movable part 20 (i.e., the movable part detection adjustment electrodes 241a and 241b) and the fixed part detection adjustment electrodes 541a and 541b placed to sandwich the movable part 20. In the angular velocity sensor 1, spring constants of the detection springs 42a and 42b are adjusted by the electric spring effect, so that the detection resonance frequency of the movable part 20 is maintained at desired fs. That is, even if a disturbance, such as a temperature change or an impact, is applied to the angular velocity sensor 1, the detection resonance frequency of the movable part 20 is maintained at desired fs.

In the second integrator 730, a predetermined voltage value (i.e., Amplitude in FIG. 3) is applied. Then, an AC voltage, having the predetermined voltage value and the frequency fs, is input to the fixed part detection excitation electrodes 551a and 551b via the second integrator 730 and the second voltage input circuit 680. Therefore, the movable part 20 performs detection resonance along the x-axis direction.

Here, in the present embodiment, the control unit 600 causes the amplitude of the detection resonance to be smaller than the amplitude of the drive resonance, when the movable part 20 is caused to perform the drive resonance and the detection resonance. For example, the control unit 600 causes the amplitude of the detection resonance to be smaller than the amplitude of the drive resonance by adjusting the amplitude of the AC voltage to be input from the first voltage input circuit 610 to the fixed part drive electrodes 501a and 501b and a bias value to be added in the first voltage input circuit 610.

The configuration of the angular velocity sensor system according to the present embodiment has been described above. Next, angular velocity detection operations using the angular velocity sensor system will be briefly described.

The angular velocity sensor system of the present embodiment is configured as described above. Therefore, in the angular velocity sensor 1, the movable part 20 vibrates along the y-axis direction when an AC voltage, having a controlled voltage value and the frequency fd, is applied to the fixed part drive electrodes 501*a* and 501*b*. At this time, in the angular velocity sensor 1, the drive resonance frequency fd is maintained by applying a DC voltage to the fixed part drive adjustment electrodes 511*a* and 511*b* on the basis of the signals from the fixed part drive monitor electrodes 521*a* and 521*b* to control the electric spring effect. Therefore, in the angular velocity sensor 1, the movable part 20 is always in a state of performing, along the y-axis direction, drive resonance with a constant and desired amplitude and at a constant and desired resonance frequency.

In addition, in the angular velocity sensor 1, the movable part 20 vibrates along the x-axis direction, when an AC voltage, having a predetermined amplitude and the frequency fs, is applied to the fixed part detection excitation electrodes 551*a* and 551*b*. At this time, in the angular velocity sensor 1, the detection resonance frequency fs is maintained by applying a DC voltage to the fixed part detection adjustment electrodes 541*a* and 541*b* on the basis of the signals from the fixed part detection electrodes 531*a* and 531*b* to control the electric spring effect. Therefore, in the angular velocity sensor 1, the movable part 20 is always in a state of performing, along the x-axis direction, detection resonance at a constant and desired resonance frequency. That is, in the angular velocity sensor system of the present embodiment, the movable part 20 is always in a state of performing drive resonance in the y-axis direction and detection resonance in the x-axis direction, in which the drive resonance frequency fd is maintained and the detection resonance frequency fs is maintained.

In the angular velocity sensor 1, when an angular velocity around the z-axis is applied in this state, the movable part 20 vibrates in the x-axis direction according to the Coriolis force. Then, the control unit 600 synchronously detects the signals based on the fixed part detection electrodes 531*a* and 531*b* by the drive resonance frequency fd, and removes frequencies equal to or larger than |fs−fd| from the synchronously detected signals, thereby detecting the angular velocity.

In the present embodiment, the movable part 20 is always in a state of performing drive resonance in the y-axis direction and detection resonance in the x-axis direction, in which the drive resonance frequency fd is maintained and the detection resonance frequency fs is maintained, as described above. That is, even if a disturbance, such as a temperature change or an impact, is applied to the angular velocity sensor 1, the movable part 20 is in a state of performing drive resonance in the y-axis direction and detection resonance in the x-axis direction. Therefore, in the angular velocity sensor system of the present embodiment, an influence of a disturbance, such as a temperature change or an impact, can be reduced, and a decrease in detection accuracy can be reduced.

In addition, the movable part 20 is always in a state of performing drive resonance in the y-axis direction and detection resonance in the x-axis direction. That is, it is not necessary to intermittently vibrate the movable part 20, so that a period, in which the angular velocity cannot be detected, is not created. Therefore, a decrease in detection accuracy can be further suppressed, and a decrease in versatility can also be suppressed.

Furthermore, in the present embodiment, the control unit 600 causes the amplitude of the detection resonance to be smaller than the amplitude of the drive resonance, when the movable part 20 is caused to perform the drive resonance and the detection resonance. Therefore, as compared with a case where the amplitude of the detection resonance is caused to be equal to or larger than the amplitude of the drive resonance, an influence of the detection resonance on the drive resonance can be reduced, and a decrease in the detection accuracy for the angular velocity can be suppressed.

That is, in the present embodiment, the movable part 20 is always in a state of performing drive resonance in the y-axis direction and detection resonance in the x-axis direction, so that the Coriolis force can also be generated in the y-axis direction when an angular velocity around the z-axis is applied. In this case, if the amplitude of the detection resonance is larger, the vibration caused by the Coriolis force in the y-axis direction increases. Therefore, by making the amplitude of the detection resonance smaller than the amplitude of the drive resonance, the Coriolis force in the y-axis direction can be reduced, and a decrease in the detection accuracy for the angular velocity can be suppressed. However, the larger the amplitude of the drive resonance, the larger the sensitivity on the detection of the angular velocity, so that it is preferable to increase the amplitude of the drive resonance.

Furthermore, in the present embodiment, the detection springs 42*a* and 42*b* are each configured to have a straight beam structure in which a hard spring effect is easily generated. In this case, by making the amplitude of the detection resonance smaller, as described above, the hard spring effect can also be suppressed. Note that in the present embodiment, even when the amplitude of the detection resonance is made smaller, a decrease in the sensitivity can be suppressed because the movable part detection electrodes 231*a* and 231*b* and the fixed part detection electrodes 531*a* and 531*b* are each formed in a comb shape in order to secure a facing area.

Modification of First Embodiment

A modification of the first embodiment will be described. First, in the first embodiment, an example has been described in which: a voltage is applied to the fixed part drive adjustment electrodes 511*a* and 511*b* to adjust the drive resonance frequency fd by the electric spring effect; and a voltage is applied to the fixed part detection adjustment electrodes 541*a* and 541*b* to adjust the drive detection frequency fs by the electric spring effect. Here, the electric spring effect can only reduce the spring constant, and can only reduce the resonance frequency.

Therefore, in the modification, an offset voltage is applied to the fixed part drive adjustment electrodes 511*a* and 511*b* in the angular velocity sensor system of the first embodiment, so that the desired drive resonance frequency fd is set to be smaller than a design value specified by beam dimensions or the like. Similarly, an offset voltage is applied to the fixed part detection adjustment electrodes 541*a* and 541*b*, so that the desired detection resonance frequency fs is set to be smaller than a design value specified by beam dimensions or the like. As a result, the spring constant can also be increased by lowering the voltage to be applied to the fixed part drive adjustment electrodes 511*a* and 511*b*. Therefore, it is possible to cope with a case where the resonance frequency increases due to the application of a disturbance such as a temperature change or an impact, and a decrease in detection accuracy can be further suppressed.

Second Embodiment

A second embodiment will be described. The second embodiment is different from the first embodiment in that the arrangement relationship among the movable part detection electrodes 231a and 231b, the movable part detection excitation electrodes 251a and 251b, the fixed part detection electrodes 531a and 531b, and the fixed part detection excitation electrodes 551a and 551b is changed. The other configurations are the same as those of the first embodiment, and thus the description thereof will be omitted here.

Figure 4:
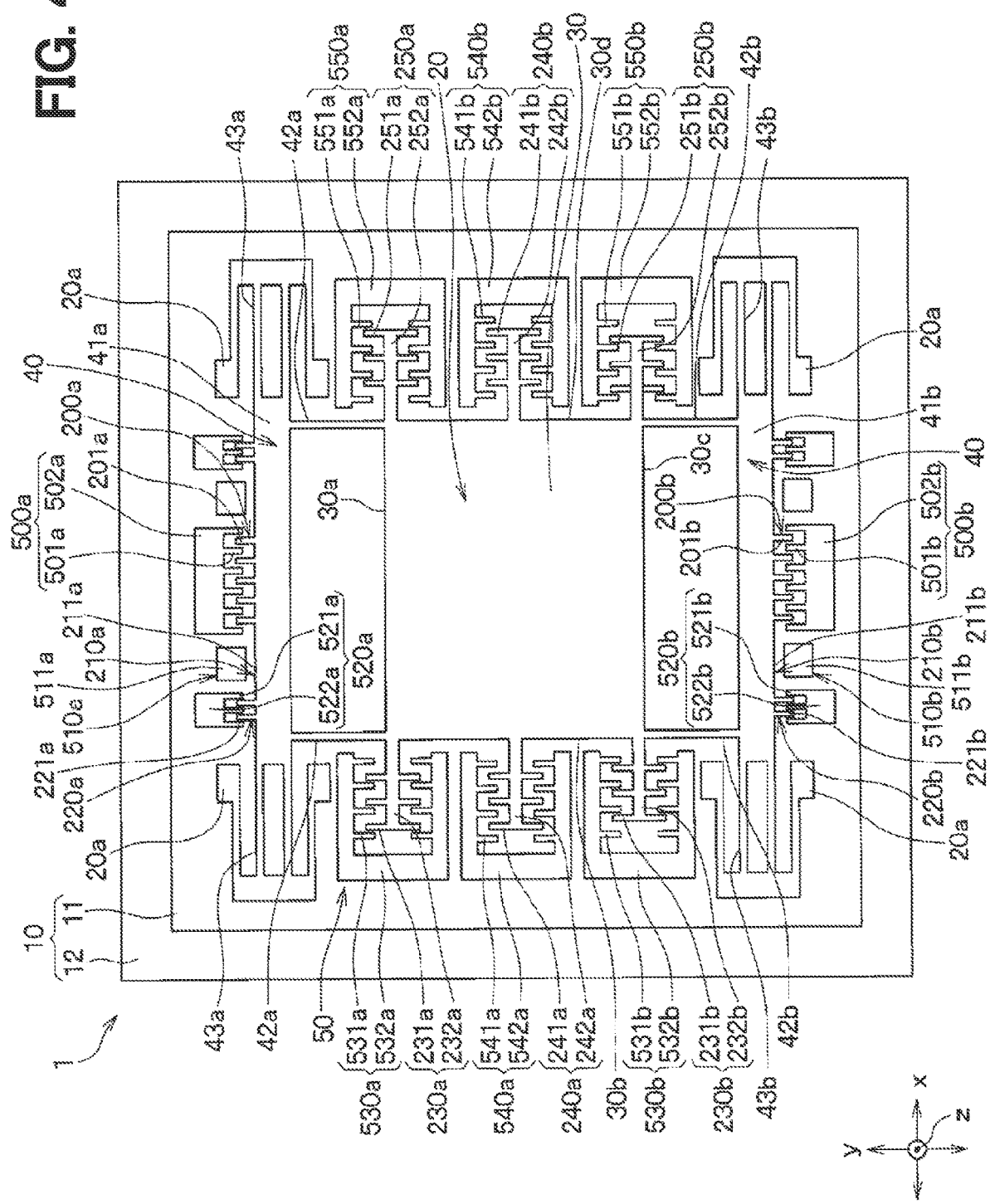
FIG. 4 is a plan view illustrating an angular velocity sensor according to a second embodiment.

In an angular velocity sensor 1 of the present embodiment, the movable part detection electrodes 231a and 231b are each provided on a side 30b that is one of a pair of sides 30b and 30d, along the y-axis direction, of the mass part 30, as illustrated in FIG. 4. In addition, the movable part detection excitation electrodes 251a and 251b are each provided on a side 30d that is the other of the pair of sides 30b and 30d, along the y-axis direction, of the mass part 30. That is, the movable part detection electrodes 231a and 231b and the movable part detection excitation electrodes 251a and 251b are placed across the mass part 30.

In the present embodiment, the movable part detection electrodes 231a and 231b are placed to sandwich the movable part detection adjustment electrode 241a formed on the side 30b of the mass part 30. The movable part detection excitation electrodes 251a and 251b are placed to sandwich the movable part detection adjustment electrode 241b formed on the side 30d of the mass part 30.

The fixed part detection electrodes 531a and 531b are placed to mesh with the comb teeth of the movable part detection electrodes 231a and 231b, respectively. The fixed part detection excitation electrodes 551a and 551b are placed to mesh with the comb teeth of the movable part detection excitation electrodes 251a and 251b, respectively. That is, the fixed part detection electrodes 531a and 531b and the fixed part detection excitation electrodes 551a and 551b are placed across the mass part 30.

That is, the movable part detection electrodes 231a and 231b and the fixed part detection electrodes 531a and 531b are each placed on one side with respect to the mass part 30. The movable part detection excitation electrodes 251a and 251b and the fixed part detection excitation electrodes 551a and 551b are each placed on the other side with respect to the mass part 30.

In addition, the movable part detection electrodes 231a and 231b and the fixed part detection electrodes 531a and 531b are formed such that the intervals between the fixed part detection electrodes 531a and 531b, adjacent to each other along the x-axis direction, and the movable part detection electrodes 231a and 231b, placed between the fixed part detection electrodes 531a and 531b, are set to be as follows.

That is, the movable part detection electrode 231a and the fixed part detection electrode 531a are formed such that the interval between the fixed part detection electrode 531a and the movable part detection electrode 231a on the mass part 30 side is larger than the interval between the fixed part detection electrode 531a and the movable part detection electrode 231a on the opposite side to the mass part 30 side.

On the other hand, the movable part detection electrode 231b and the fixed part detection electrode 531b are formed such that the interval between the fixed part detection electrode 531b and the movable part detection electrode 231b on the mass part 30 side is smaller than the interval between the fixed part detection electrode 531b and the movable part detection electrode 231b on the side opposite to the mass part 30 side. That is, in the present embodiment, the movable part detection electrode 231a and the fixed part detection electrode 531a, and the movable part detection electrode 231b and the fixed part detection electrode 531b, are formed such that a region having a larger interval and a region having a smaller interval are opposite to each other.

Similarly, the movable part detection excitation electrodes 251a and 251b and the fixed part detection excitation electrodes 551a and 551b are formed such that the intervals between the fixed part detection excitation electrodes 551a and 551b, adjacent to each other along the x-axis direction, and the movable part detection excitation electrodes 251a and 251b, placed between the fixed part detection excitation electrodes 551a and 551b, are set as follows.

That is, the movable part detection excitation electrode 251a and the fixed part detection excitation electrode 551a are formed such that the interval between the fixed part detection excitation electrode 551a and the movable part detection excitation electrode 251a on the mass part 30 side is larger than the interval between the fixed part detection excitation electrode 551a and the movable part detection excitation electrode 251a on the opposite side to the mass part 30 side.

On the other hand, the movable part detection excitation electrode 251b and the fixed part detection excitation electrode 551b are formed such that the interval between the fixed part detection excitation electrode 551b and the movable part detection excitation electrode 251b on the mass part 30 side is smaller than the interval between the fixed part detection excitation electrode 551b and the movable part detection excitation electrode 251b on the opposite side to the mass part 30 side. That is, in the present embodiment, the movable part detection excitation electrode 251a and the fixed part detection excitation electrode 551a, and the movable part detection excitation electrode 251b and the fixed part detection excitation electrode 551b, are formed such that a region having a larger interval and a region having a smaller interval are opposite to each other. As a result, a similar angular velocity sensor system can be configured using the control unit 600 illustrated in FIG. 2.

According to this, the fixed part detection electrodes 531a and 531b and the fixed part detection excitation electrodes 551a and 551b are placed across the mass part 30. Therefore, it is difficult to displace the wiring or the like to be connected to the fixed part detection electrodes 531a and 531b and the wiring or the like to be connected to the fixed part detection excitation electrodes 551a and 551b so as to be close to each other. Therefore, interference between the wirings can be suppressed, and detection accuracy can be improved while control is stabilized.

Third Embodiment

A third embodiment will be described. The third embodiment is different from the second embodiment in that the configuration of the mass part 30 is changed. The other configurations are the same as those of the second embodiment, and thus the description thereof will be omitted here.

Figure 5:
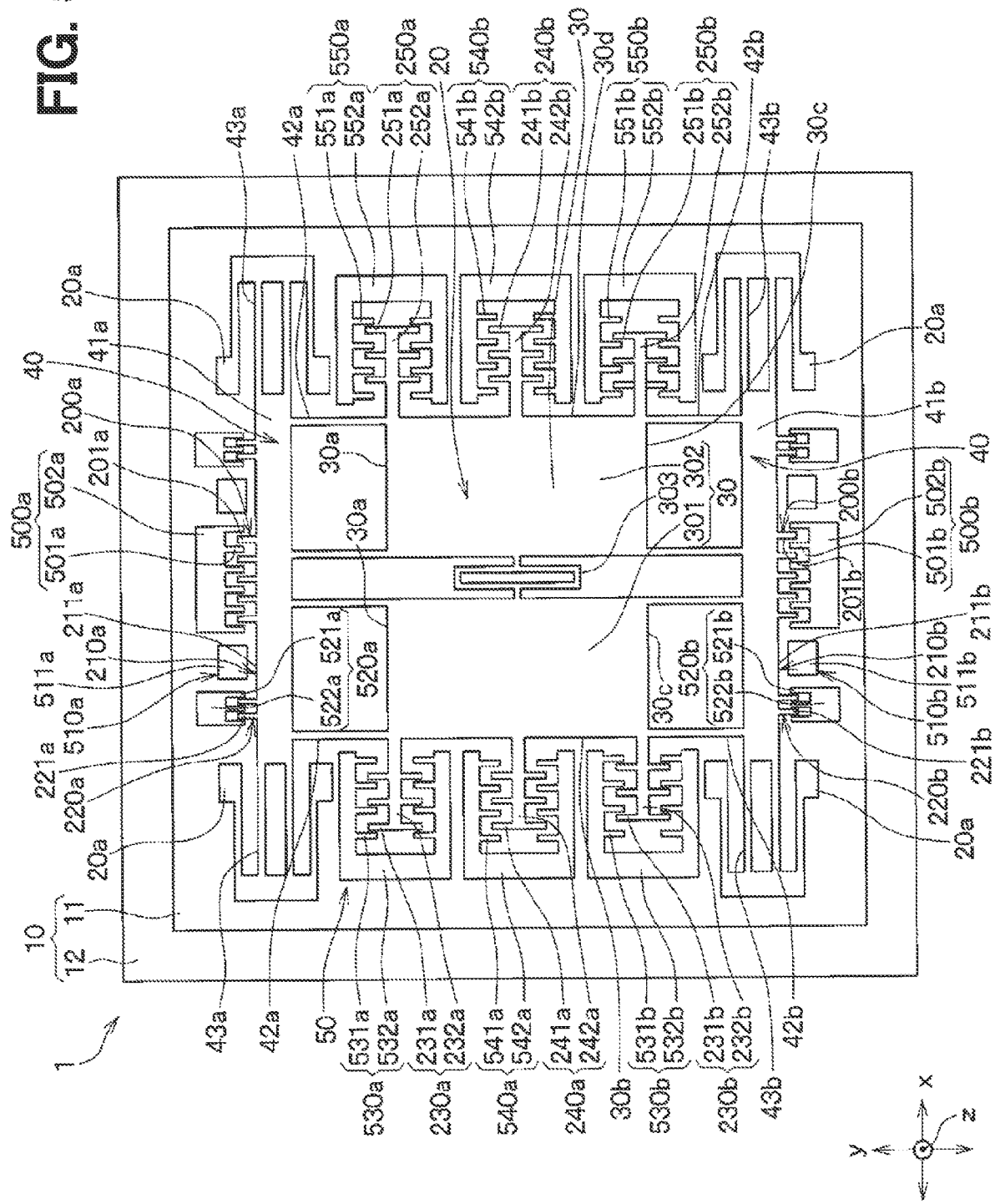
FIG. 5 is a plan view illustrating an angular velocity sensor according to a third embodiment.

In an angular velocity sensor 1 of the present embodiment, the mass part 30 is divided into a first mass part 301 and a second mass part 302 that are arrayed along the x-axis direction, as illustrated in FIG. 5. Note that the first mass part 301 and the second mass part 302 are configured to have the same size and the same mass.

The first mass part 301 and the second mass part 302 are connected via a link spring 303 that displaces the first mass part 301 and the second mass part 302 in the x-axis direction. The first mass part 301 and the second mass part 302 are connected to the plates 41a and 41b via the detection springs 42a and 42b, respectively.

Figure 6A:
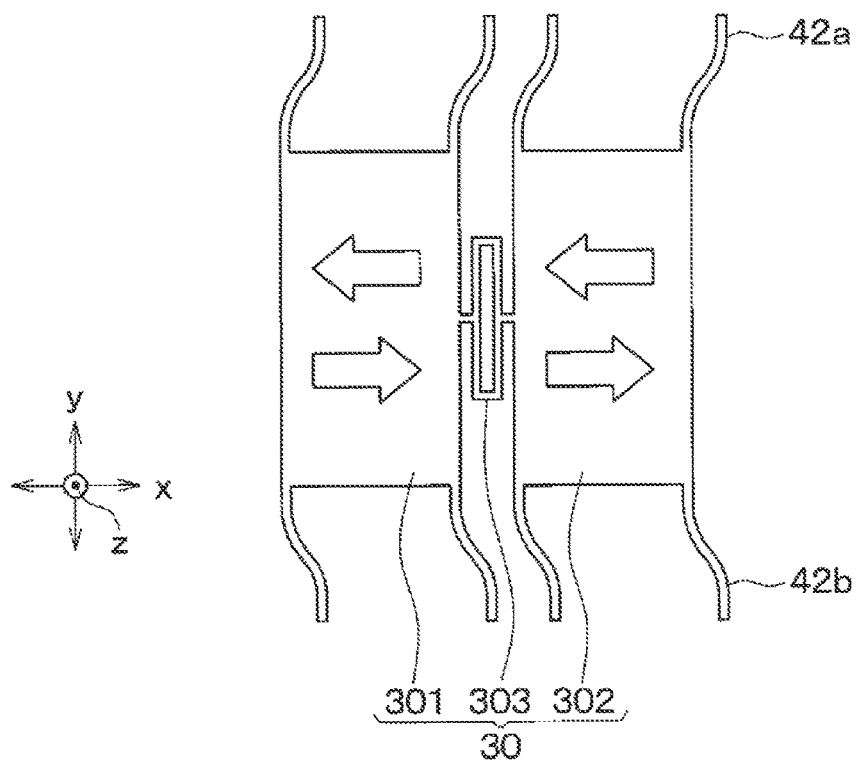
FIG. 6A is a schematic view illustrating a state of a mass part in a detection mode.
Figure 6B:
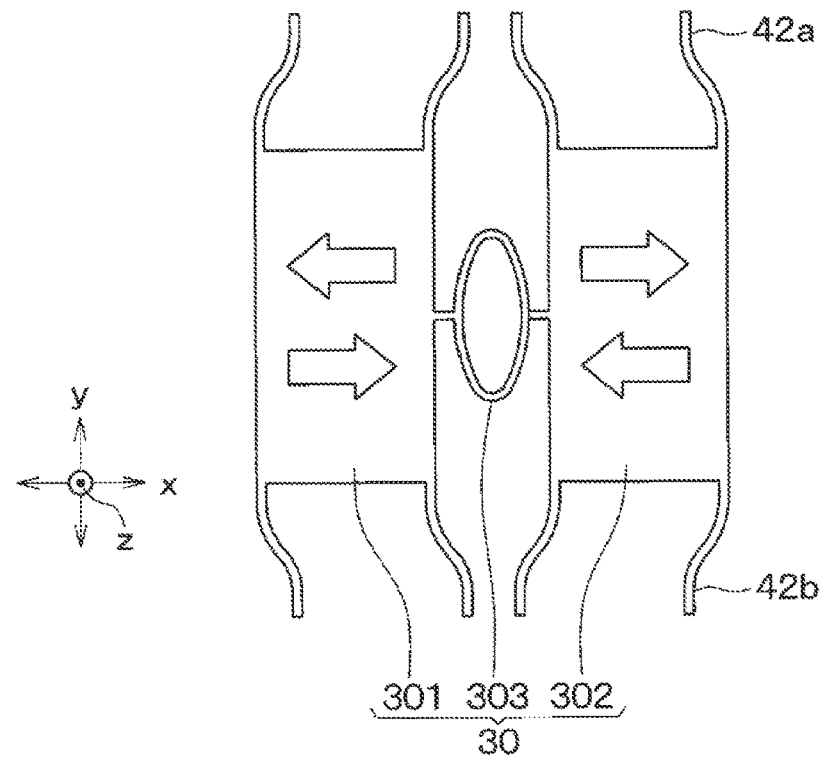
FIG. 6B is a schematic view illustrating a state of the mass part in a non-detection mode.

Here, since the mass part 30 is configured to have the above-described configuration, the movable part 20 can vibrate in an in-phase mode in the x-axis direction, in which the first mass part 301 and the second mass part 302 are displaced in the same direction, as illustrated in FIG. 6A. In addition, the movable part 20 can vibrate in a reverse phase mode, in which the first mass part 301 and the second mass part 302 are displaced in opposite directions, as illustrated in FIG. 6B. In the present embodiment, the movable part 20 is vibrated in the reverse phase mode when an angular velocity is not applied. When an angular velocity is applied, vibration in the in-phase mode is added by the Coriolis force. Therefore, in the following description, the vibration, in the reverse phase mode, of the mass part 30 is also referred to as vibration in a non-detection mode, and the vibration, in the in-phase mode, of the mass part 30 is also referred to as vibration in a detection mode.

Figure 7:
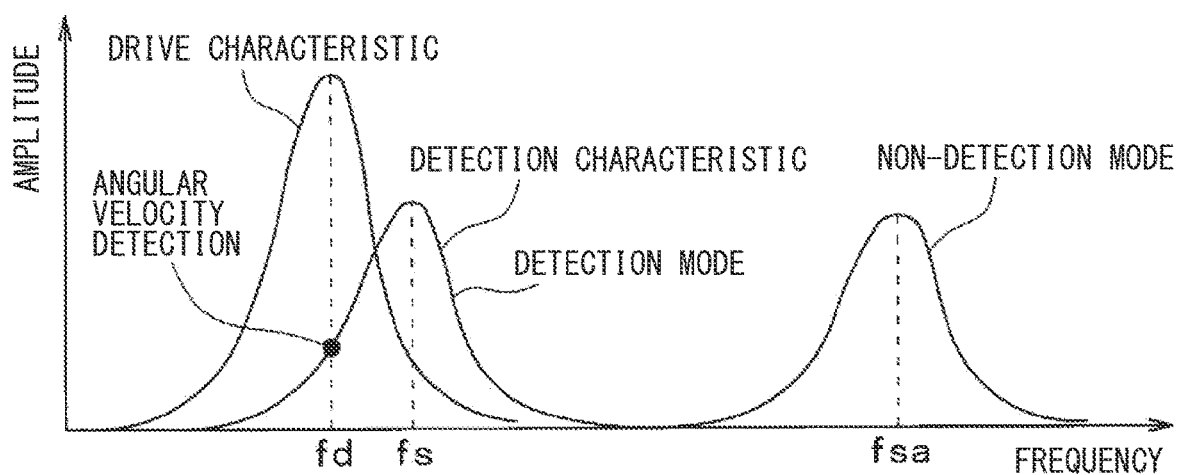
FIG. 7 is a graph showing a relationship between a drive characteristic and a detection characteristic of a movable part.

With the configuration as described above, the movable part 20 has a configuration that has a detection resonance frequency fs in the detection mode and a non-detection resonance frequency fsa in the non-detection mode, as illustrated in FIG. 7. That is, the movable part 20 of the present embodiment has a configuration that has different resonance frequencies in the direction along the x-axis direction. Note that in FIG. 7, a relationship between the frequency and the amplitude related to the vibration, along the y-axis direction, of the movable part 20 is shown as a drive characteristic, and a relationship between the frequency and the amplitude related to the vibration, along the x-axis direction, of the movable part 20 is shown as a detection characteristic, similarly to FIG. 2. In addition, in the present embodiment, the drive resonance frequency fd and the non-detection resonance frequency fsa are set to different values.

Furthermore, in the present embodiment, each of the detection springs 42a and 42b and the link spring 303 are formed to have the same cross-sectional shape with the y-axis direction as a normal direction. That is, each of the detection springs 42a and 42b and the link spring 303 are formed to have the same cross-sectional shape along a bending direction. That is, each of the detection springs 42a and 42b and the link spring 303 are formed such that a beam width along the x-axis direction and a beam thickness along the z-axis direction are equal. Therefore, if the beam expands due to an influence of a temperature change or the like, a difference in deformation between each of the detection springs 42a and 42b and the link spring 303 becomes small. As a result, even if a temperature change or the like occurs, it is difficult to change the relationship between the detection resonance frequency fs and the non-detection resonance frequency fsa.

Note that in the present embodiment, the movable part detection electrodes 231a and 231b and the fixed part detection electrodes 531a and 531b are placed on one side with respect to the mass part 30, similarly to the second embodiment. The movable part detection excitation electrodes 251a and 251b and the fixed part detection excitation electrodes 551a and 551b are placed on the other side with respect to the mass part 30. The movable part detection electrodes 231a and 231b and the fixed part detection electrodes 531a and 531b are formed such that a region having a larger interval and a region having a smaller interval are opposite to each other. The movable part detection excitation electrodes 251a and 251b and the fixed part detection excitation electrodes 551a and 551b are formed such that a region having a larger interval and a region having a smaller interval are opposite to each other. Therefore, while the movable part 20 is vibrating in the detection mode, and while the movable part 20 is vibrating in the non-detection mode, differential amplification can be suitably obtained.

Figure 8:
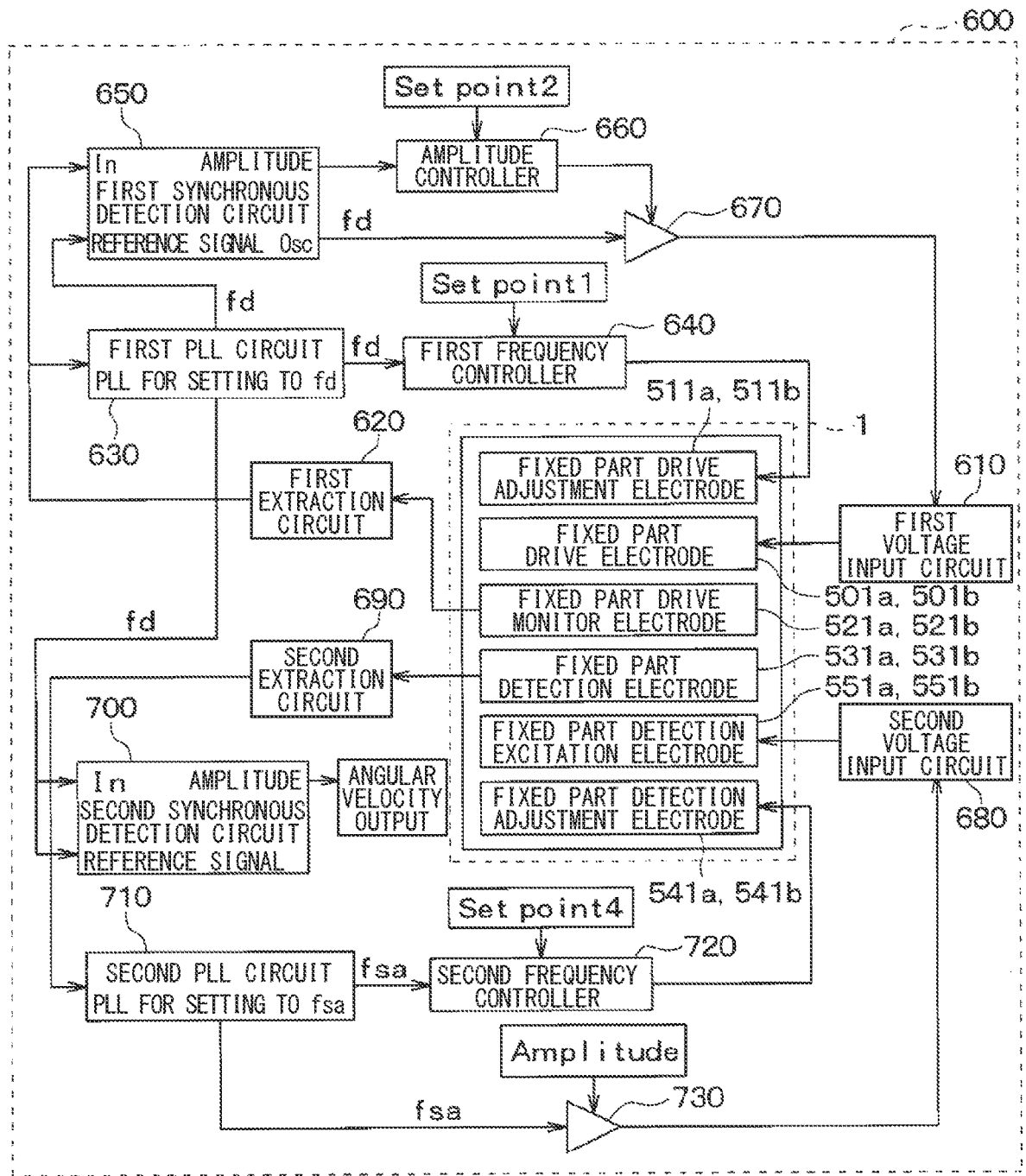
FIG. 8 is a block diagram illustrating an angular velocity sensor system according to the third embodiment.

Next, an angular velocity sensor system of the present embodiment will be described on portions different from those of the first embodiment, with reference to FIG. 8. In FIG. 8, fd and fsa indicate frequencies.

The second PLL circuit 710 outputs the signal input from the second extraction circuit 690 such that the frequency of the signal becomes the non-detection resonance frequency fsa in the non-detection mode.

The second frequency controller 720 is connected to the second PLL circuit 710, and quantifies the frequency of the signal output from the second PLL circuit 710. Then, the second frequency controller 720 applies a DC voltage to the fixed part detection adjustment electrodes 541a and 541b such that the quantified frequency becomes a desired non-detection resonance frequency (i.e., Set point4 in the view). As a result, an electric spring effect is generated between the movable part 20 (i.e., the movable part detection adjustment electrodes 241a and 241b) and the fixed part detection adjustment electrodes 541a and 541b. Then, in the angular velocity sensor 1, the spring constants of the detection springs 42a and 42b and the link spring 303 are adjusted by the electric spring effect, and the non-detection resonance frequency of the movable part 20 is maintained at fsa. Therefore, the detection resonance frequency, in the detection mode, of the movable part 20 is maintained at fs. That is, in the present embodiment, the detection resonance frequency fs in the detection mode is indirectly maintained with the non-detection resonance frequency fsa in the non-detection mode maintained constant.

In the second integrator 730, a predetermined voltage value (i.e., Amplitude in FIG. 8) is applied. Then, an AC voltage, having a predetermined amplitude and the frequency fsa, is input to the fixed part detection excitation electrodes 551a and 551b via the second integrator 730 and the second voltage input circuit 680. Therefore, the movable part 20 performs, along the x-axis direction, detection resonance in the non-detection mode.

In addition, the second synchronous detection circuit 700 reduces an influence of the detection resonance by the LPF. In the present embodiment, the movable part 20 is caused to perform detection resonance at the non-detection resonance frequency fsa, as described above, so that the LPF removes frequencies equal to or larger than the absolute value (i.e., |fsa−fd|) of the difference between the drive resonance frequency fd and the non-detection resonance frequency fsa. As a result, the angular velocity is detected.

In the present embodiment, the mass part 30 is configured to have a configuration having, in the direction along the x-axis direction, the detection resonance frequency fs and the non-detection resonance frequency fsa, in which the first mass part 301 and the second mass part 302 are connected via the link spring 303, as described above. The control unit 600 maintains the detection resonance frequency fs by maintaining the non-detection resonance frequency fsa, along the x-axis direction, of the movable part 20. Then, the control unit 600 detects the angular velocity by removing the frequencies equal to or larger than |fsa−fd|. Therefore, even when the drive resonance frequency fd and the detection resonance frequency fs are close to each other, a cutoff frequency can be increased. Therefore, a detection band for the angular velocity can be improved.

In addition, in the present embodiment, the frequency of the vibration due to the Coriolis force is different from the non-detection resonance frequency fsa even when the drive resonance frequency fd matches the detection resonance frequency fs, so that only the vibration due to the Coriolis force can be effectively extracted.

Furthermore, in the present embodiment, each of the detection springs 42a and 42b and the link spring 303 are formed to have the same cross-sectional shape with the y-axis direction as a normal direction. Therefore, if the beam expands due to an influence of a temperature change or the like, a difference in deformation between each of the detection springs 42a and 42b and the link spring 303 becomes small. Therefore, it is difficult to change the relationship between the detection resonance frequency fs and the non-detection resonance frequency fsa. As a result, the detection resonance frequency fs is also maintained by maintaining the non-detection resonance frequency fsa, so that a decrease in detection accuracy can be further suppressed.

Fourth Embodiment

A fourth embodiment will be described. The present embodiment is different from the third embodiment in that the operation of the second frequency controller 720 is changed. The other configurations are the same as those of the third embodiment, and thus the description thereof will be omitted here.

Figure 9:
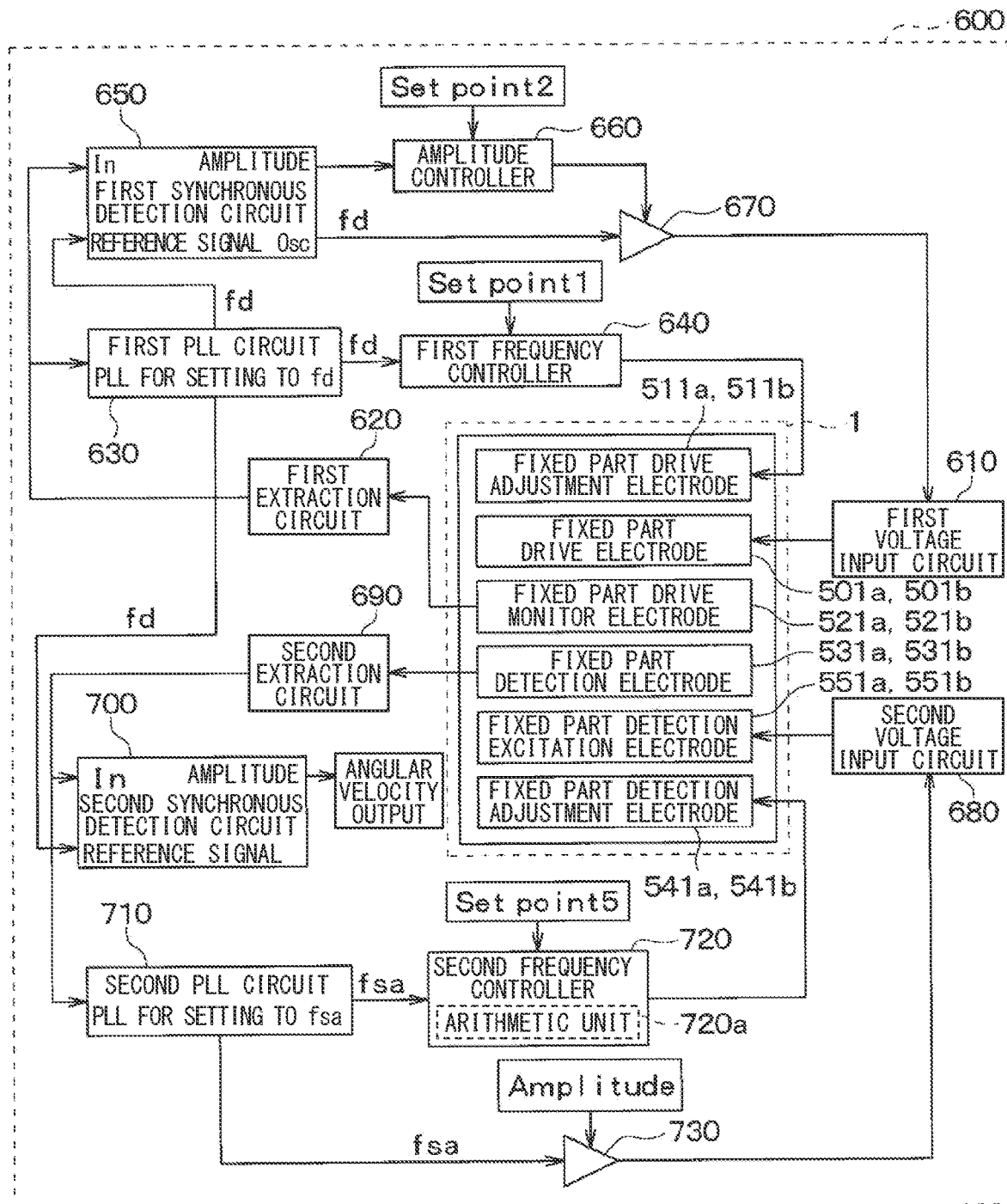
FIG. 9 is a block diagram illustrating an angular velocity sensor system according to a fourth embodiment.

The configuration of an angular velocity sensor 1 of the present embodiment is similar to that of the third embodiment. With reference to FIG. 9, an angular velocity sensor system of the present embodiment will be described on portions different from those of the third embodiment. In FIG. 9, fd and fsa indicate frequencies.

A second frequency controller 720 of the present embodiment is configured to be able to estimate the detection resonance frequency fs from the non-detection resonance frequency fsa. Specifically, in the present embodiment, the relationship between the detection resonance frequency fs and the non-detection resonance frequency fsa is grasped in advance by experiment or the like. The second frequency controller 720 is configured to include an arithmetic unit 720a having a storage unit in which the relationship between the detection resonance frequency fs and the non-detection resonance frequency fsa is stored in advance.

The second frequency controller 720 estimates, by using the arithmetic unit 720a, the detection resonance frequency fs in the detection mode from the frequency fsa of the signal output from the second PLL circuit 710. The second frequency controller 720 applies a DC voltage to the fixed part detection adjustment electrodes 541a and 541b such that the estimated frequency becomes a desired detection resonance frequency (i.e., Set point5 in FIG. 9). As a result, the spring constants of the detection springs 42a and 42b and the link spring 303 are adjusted by an electric spring effect generated between the movable part 20 (i.e., the movable part detection adjustment electrodes 241a and 241b) and the fixed part detection adjustment electrodes 541a and 541b, so that the detection resonance frequency of the movable part 20 is maintained at fs. That is, in the present embodiment, the resonance frequency fs in the detection mode is directly maintained as compared with the third embodiment.

In the present embodiment, the relationship between the non-detection resonance frequency fsa in the non-detection mode and the detection resonance frequency fs in the detection mode is grasped in advance, as described above. Therefore, a relationship in which an error, such as a variation in manufacturing the link spring 303, is also taken into consideration is grasped. Then, the control unit 600 estimates the detection resonance frequency fs in the detection mode from the signal output from the second PLL circuit 710, and maintains the estimated detection resonance frequency fs in the detection mode at a constant value. Therefore, the angular velocity can be detected with higher accuracy.

Fifth Embodiment

A fifth embodiment will be described. The fifth embodiment is different from the first embodiment in that a first FtR (abbreviation of force to resistance) controller, a second FtR controller, and the like are added to the control unit 600. The other configurations are the same as those of the first embodiment, and thus the description thereof will be omitted here.

Figure 10:
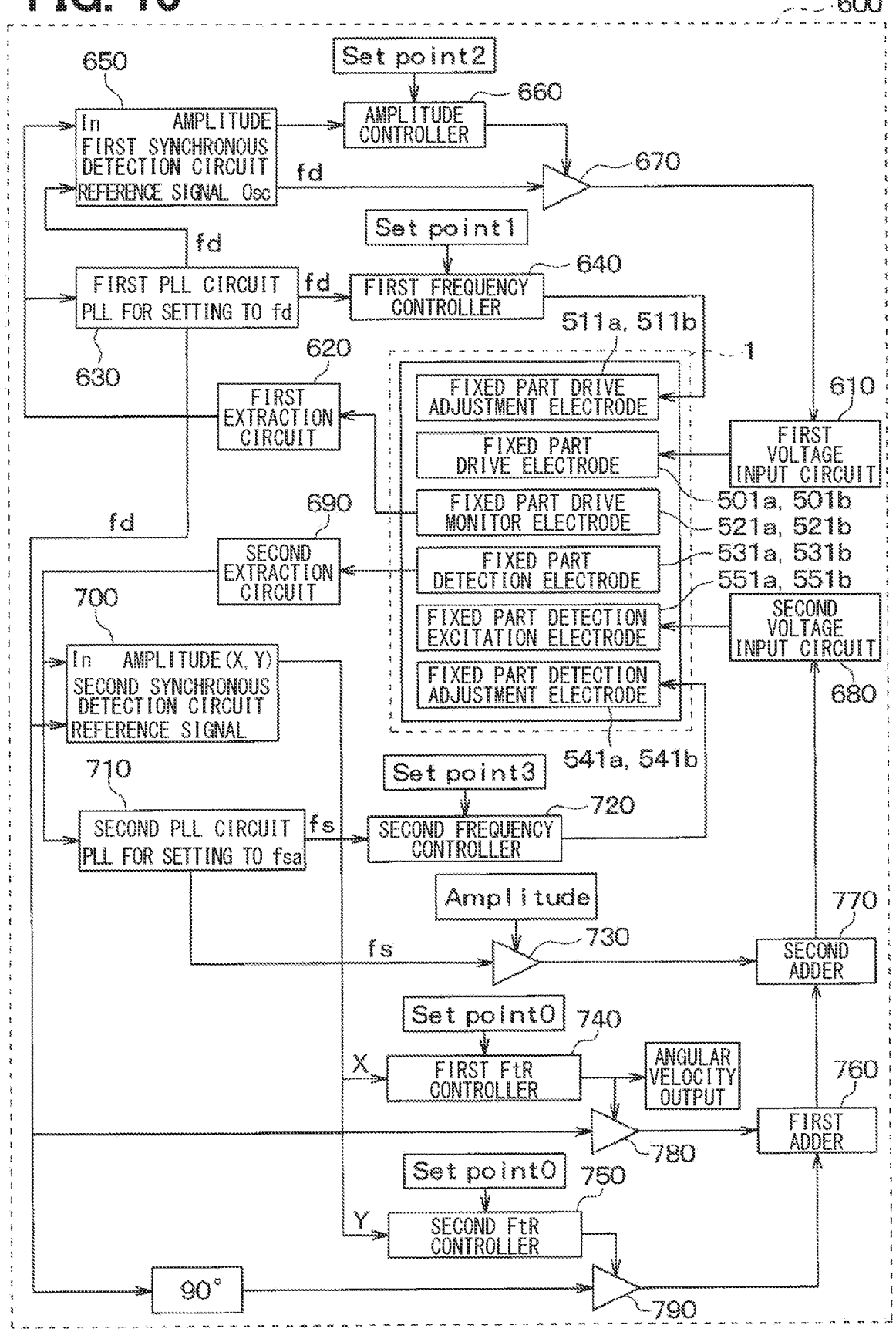
FIG. 10 is a block diagram illustrating an angular velocity sensor system according to a fifth embodiment.

The configuration of an angular velocity sensor 1 of the present embodiment is similar to that of the first embodiment. With reference to FIG. 10, an angular velocity sensor system of the present embodiment will be described on portions different from those of the first embodiment. In FIG. 10, fd and fs indicate frequencies, and X and Y indicate types of signals.

As illustrated in FIG. 10, a first FtR controller 740, a second FtR controller 750, a first adder 760, a second adder 770, a third integrator 780, and a fourth integrator 790 are added to a control unit 600 of the present embodiment.

The first FtR controller 740 and the second FtR controller 750 are connected to the second synchronous detection circuit 700. The first adder 760 is connected to the first FtR controller 740 and the first PLL circuit 630 via the third integrator 780, and is connected to the second FtR controller 750 and the first PLL circuit 630 via the fourth integrator 790. The second adder 770 is connected to the first adder 760, and is connected to the second PLL circuit 710 via the second integrator 730.

Hereinafter, in the signal output from the second synchronous detection circuit 700, an amplitude amount of a component having the same phase as the reference signal is defined as an X output, and an amplitude amount of a component having a phase different from that of the reference signal by 90° is defined as a Y output.

The first FtR controller 740 receives the X output from the second synchronous detection circuit 700, and outputs an AC voltage having a frequency fd (i.e., Set point0 in FIG. 10) that feedback-controls the X output to 0 via the third integrator 780. Then, the angular velocity is detected on the basis of the signal output from the first FtR controller 740.

The second FtR controller 750 receives the Y output from the second synchronous detection circuit 700, and outputs an AC voltage having a frequency fd (i.e., Set point0 in FIG. 10) that feedback-controls the Y output to 0 via the fourth integrator 790. The phase of the signal output from the fourth integrator 790 is different from that of the signal output from the third integrator 780 by 90°. As will be described later, the present embodiment can also be applied to the third embodiment. When the drive resonance frequency fd and the detection resonance frequency fs match each other, the angular velocity is detected on the basis of the signal output from the second FtR controller 750.

The first adder 760 adds the signals input from the first FtR controller 740 and the first PLL circuit 630 via the third integrator 780 to the signals input from the second FtR controller 750 and the first PLL circuit 630 via the fourth integrator 790, and then outputs the signals to the second adder 770. Note that a signal having a phase different from that of the signal output from the first PLL circuit 630 by 90° is input to the fourth integrator 790.

The second adder 770 adds the signal input from the second PLL circuit 710 via the second integrator 730 to the signal input from the first adder 760, and outputs the added signal to the second voltage input circuit 680. As a result, an AC voltage obtained by superimposing an AC voltage that does not cause the mass part 30 to vibrate at the frequency fd along the x-axis direction and an AC voltage that causes the mass part 30 to vibrate at the frequency fs is applied to the fixed part detection excitation electrodes 551a and 551b. That is, an AC voltage, containing a voltage that cancels the Coriolis force, is applied to the fixed part detection excitation electrodes 551a and 551b. Therefore, the movable part 20 is in a state of being controlled such that the amplitude of vibration having the frequency fd, along the x-axis direction, of the mass part 30 is always 0.

In the present embodiment, the first FtR controller 740, the second FtR controller 750, and the like are provided to perform feedback control in which the amplitude of vibration having the frequency fd, along the x-axis direction, of the mass part 30 is always 0, as described above. Therefore, the angular velocity sensor 1 can enhance responsiveness even when a Q value of the movable part 20 serving as a vibrator is increased or even when the difference between the drive resonance frequency fd and the detection resonance frequency fs is small.

Sixth Embodiment

A sixth embodiment will be described. The sixth embodiment is different from the fifth embodiment in that movable part FtR electrodes and fixed part FtR electrodes are provided. The other configurations are the same as those of the fifth embodiment, and thus the description thereof will be omitted here.

Figure 11:
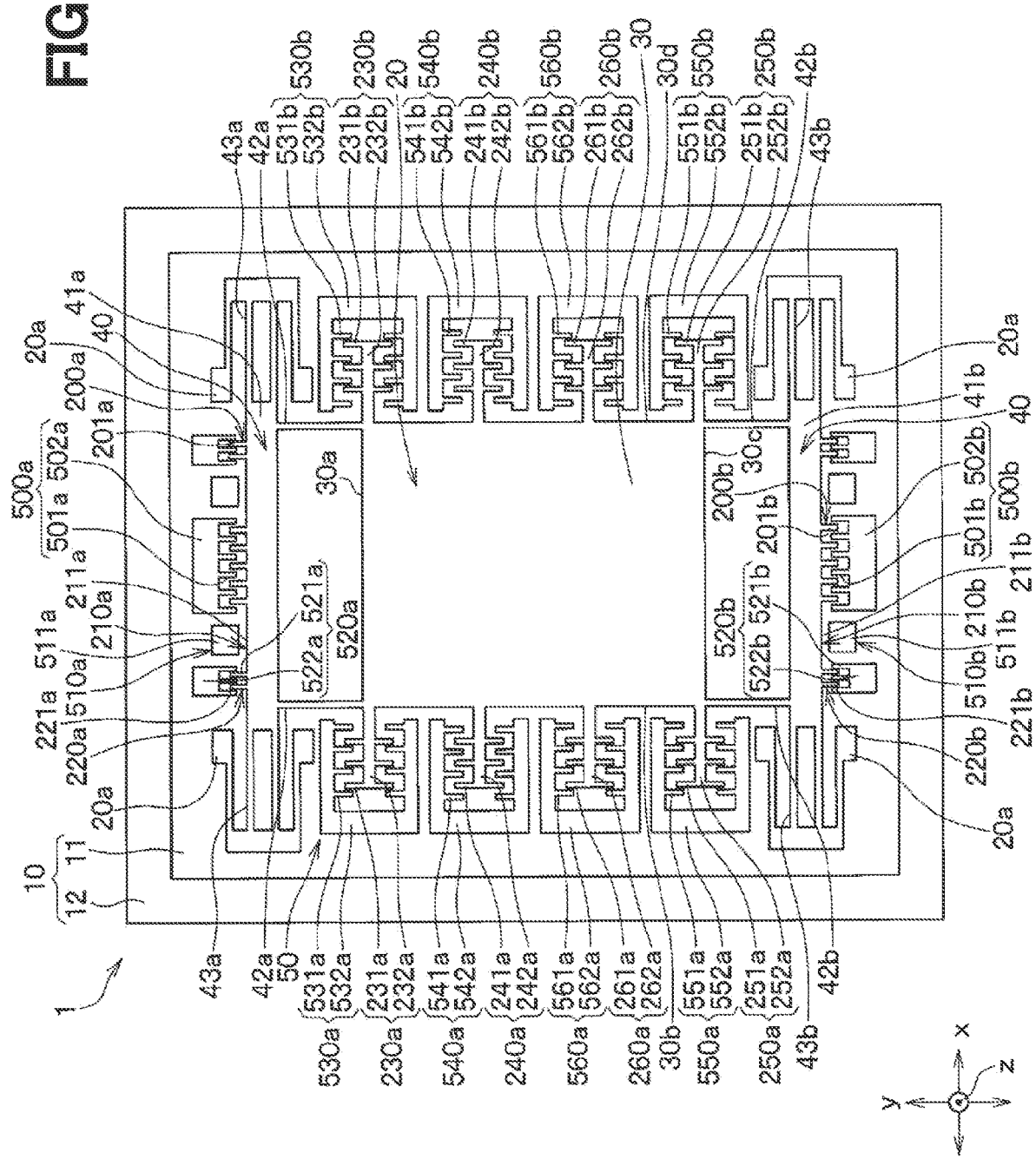
FIG. 11 is a plan view illustrating an angular velocity sensor according to a sixth embodiment.

First, a configuration of an angular velocity sensor 1 of the present embodiment will be described. As illustrated in FIG. 11, the angular velocity sensor 1 of the present embodiment includes movable part FtR electrode parts 260a and 260b and fixed part FtR electrode parts 560a and 560b.

The movable part FtR electrode parts 260a and 260b are provided on sides 30b and 30d, along the y-axis direction, of the mass part 30, respectively. The movable part FtR electrode parts 260a and 260b are configured to include movable part FtR electrodes 261a and 261b and support parts 262a and 262b that support the movable part FtR electrodes 261a and 261b, respectively. Specifically, the support parts 262a and 262b are each formed to protrude from the mass part 30 along the x-axis direction. The movable part FtR electrodes 261a and 261b are provided in the support parts 262a and 262b so as to be extended from the support parts 262a and 262b along the y-axis direction, respectively. The movable part FtR electrodes 261a and 261b are extended on both sides of the support parts 262a and 262b, respectively.

The fixed part FtR electrode parts 560a and 560b are configured to include fixed part FtR electrodes 561a and 561b extended in the y-axis direction so as to mesh with the comb teeth of the movable part FtR electrodes 261a and 261b, and support parts 562a and 562b that support the fixed part FtR electrodes 561a and 561b, respectively.

In addition, the relationships of the intervals between the movable part FtR electrodes 261a and 261b and between the fixed part FtR electrodes 561a and 561b are set to be the same as the relationships of the intervals between the movable part detection electrodes 231a and 231b and between the fixed part detection electrodes 531a and 531b, respectively. That is, the movable part FtR electrodes 261a and 261b and the fixed part FtR electrodes 561a and 561b are formed such that the intervals between the fixed part FtR electrodes 561a and 561b and the movable part FtR electrodes 261a and 261b on the mass part 30 side are larger than the intervals between the fixed part FtR electrodes 561a and 561b and the movable part FtR electrodes 261a and 261b on the opposite side to the mass part 30 side.

Figure 12:
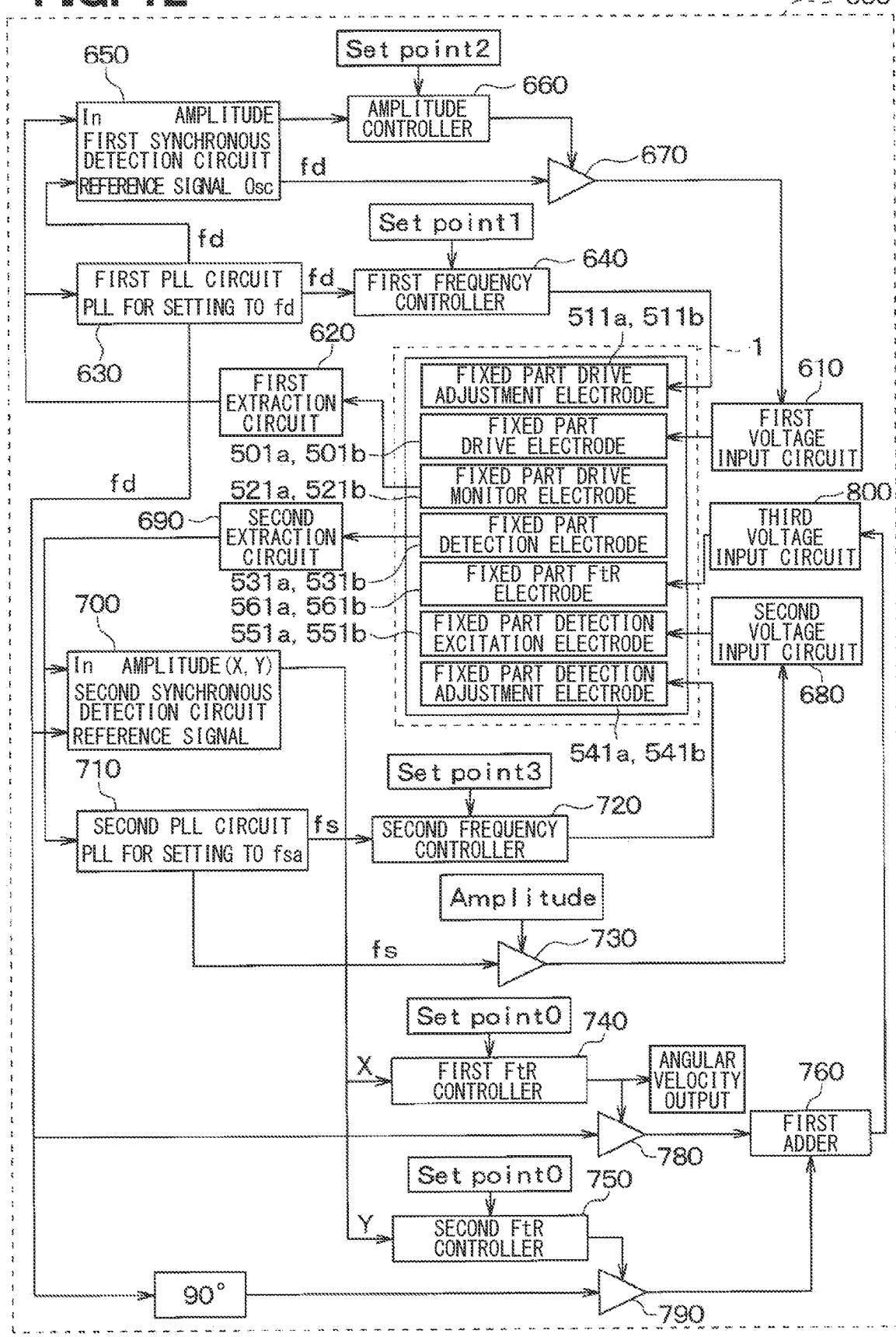
FIG. 12 is a block diagram illustrating an angular velocity sensor system according to the sixth embodiment.

Next, an angular velocity sensor system of the present embodiment will be described on portions different from those of the fifth embodiment, with reference to FIG. 12. In FIG. 12, fd and fs indicate frequencies.

In the present embodiment, the fixed part FtR electrodes 561a and 561b are formed in the angular velocity sensor 1, as described above, so that a predetermined voltage can be applied to the fixed part FtR electrodes 561a and 561b. Therefore, as compared with the fifth embodiment, the control unit 600 is configured to include a third voltage input circuit 800 instead of the second adder 770.

Similarly to the first voltage input circuit 610 and the second voltage input circuit 680, the third voltage input circuit 800 is configured to include a bias addition circuit, a phase inversion circuit, a non-inversion circuit, and the like, and is connected to the respective fixed part FtR electrodes 561a and 561b. The third voltage input circuit 800 is also connected to the first adder 760.

While adding a predetermined bias to the input signal, the third voltage input circuit 800 generates two types of signals: a signal whose phase is inverted by 180° and a non-inverted signal. The third voltage input circuit 800 inputs the inverted signal to one of the respective fixed part FtR electrodes 561a and 561b, and inputs the non-inverted signal to the other. As a result, the movable part 20 is in a state of being feedback-controlled such that the amplitude of vibration having the frequency fd, along the x-axis direction, of the mass part 30 is 0.

In the present embodiment, the angular velocity sensor 1 includes the movable part FtR electrodes 261a and 261b and the fixed part FtR electrodes 561a and 561b, as described above. Therefore, it is sufficient to separately control an AC voltage to be applied to the fixed part detection excitation electrodes 551a and 551b and an AC voltage to be applied to the fixed part FtR electrodes 561a and 561b, so that detection accuracy can be improved while the control is being stabilized.

Seventh Embodiment

A seventh embodiment will be described. The seventh embodiment is different from the first embodiment in that a third synchronous detection circuit is added to the control unit 600. The other configurations are the same as those of the first embodiment, and thus the description thereof will be omitted here.

Figure 13:
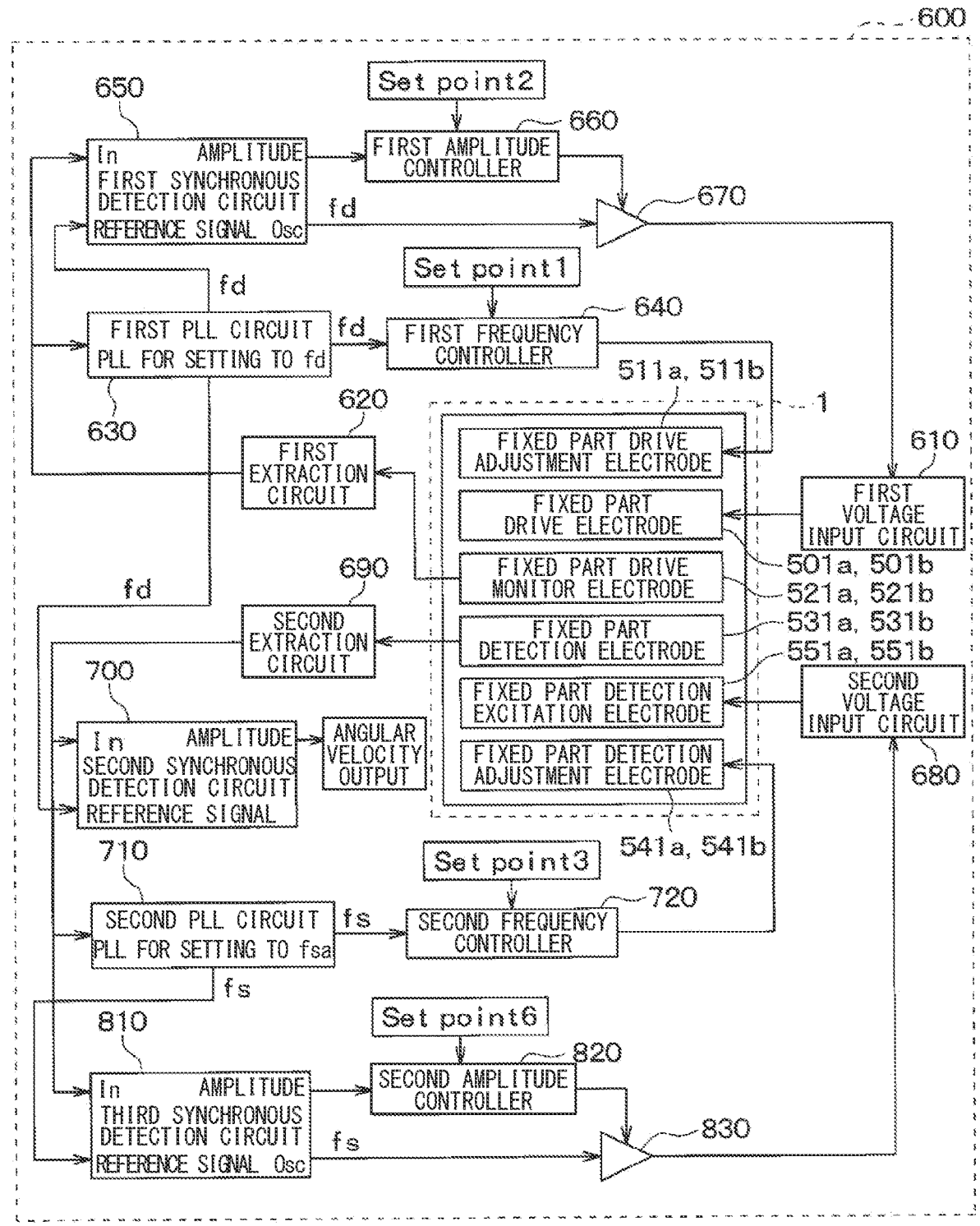
FIG. 13 is a block diagram illustrating an angular velocity sensor system according to a seventh embodiment.

With reference to FIG. 13, an angular velocity sensor system of the present embodiment will be described on portions different from those of the first embodiment. In FIG. 13, fd and fs indicate frequencies.

To a control unit 600 of the present embodiment, a third synchronous detection circuit 810, a second amplitude controller 820, and a fifth integrator 830 are added. FIG. 13 illustrates the amplitude controller 660 illustrated in FIG. 3 as a first amplitude controller 660.

The third synchronous detection circuit 810 is connected to the second extraction circuit 690 and the second PLL circuit 710, and synchronously detects the signal output from the second extraction circuit 690 using the signal output from the second PLL circuit 710 as a reference signal. Then, the third synchronous detection circuit 810 outputs an amplitude amount of the same frequency component as the reference signal to the second amplitude controller 820, and outputs a signal having the same frequency as the reference signal to the fifth integrator 830.

The second amplitude controller 820 is connected to the third synchronous detection circuit 810. When the amplitude amount is input from the third synchronous detection circuit 810, the second amplitude controller 820 adjusts a voltage value so as to obtain a desired amplitude amount (i.e., Set point6 in FIG. 13) of detection resonance, and outputs the adjusted voltage value to the fifth integrator 830. As a result, an AC voltage, having the controlled voltage value and the frequency fs, is input to the fixed part detection excitation electrodes 551a and 551b via the fifth integrator 830 and the second voltage input circuit 680.

Therefore, the movable part 20 performs, along the x-axis direction, detection resonance with a constant amplitude.

According to this, even if a temperature change, an impact, or the like is applied, the amplitude of the detection resonance can be maintained constant. Therefore, the detection resonance frequency fs can be detected with high accuracy, and the desired detection resonance frequency fs can be easily maintained. Therefore, the detection accuracy for the angular velocity can be further improved.

Other Embodiments

Although the present disclosure has been described in accordance with the embodiments, it is understood that the present disclosure is not limited to the embodiments and structures. The present disclosure also encompasses various modifications and variations within the scope of equivalents. In addition, various combinations and modes, and other combinations and modes including only one element, more elements, or less elements are also within the scope and idea of the present disclosure.

For example, in each of the above embodiments, an example has been described in which the drive spring adjustment parts include the movable part drive adjustment electrodes 211a and 211b and the fixed part drive adjustment electrodes 511a and 511b, and the spring constants of the drive springs 43a and 43b are adjusted by the electric spring effect. However, the drive spring adjustment parts may have other configurations as long as the spring constants of the drive springs 43a and 43b are adjusted. For example, the drive spring adjustment parts may be configured by other members that adjust the spring constants of the drive springs 43a and 43b by electromagnetic force. In addition, the drive spring adjustment parts may be configured by yet other members that adjust the spring constants of the drive springs 43a and 43b by changing the physical property values of the drive springs 43a and 43b by changing temperature, or by deforming the shapes of the springs.

Similarly, in each of the above embodiments, an example has been described in which the detection spring adjustment parts includes the movable part detection adjustment electrodes 241a and 241b and the fixed part detection adjustment electrodes 541a and 541b, and the spring constants of the detection springs 42a and 42b are adjusted by the electric spring effect. However, the detection spring adjustment parts may have other configurations as long as the spring constants of the detection springs 42a and 42b are adjusted. That is, the detection spring adjustment parts may be configured by other members that adjust the spring constants of the detection springs 42a and 42b by electromagnetic force, similarly to the drive spring adjustment parts described above, or may be configured by even yet other members that adjust the spring constants of the detection springs 42a and 42b with temperature.

Furthermore, in each of the above embodiments, an example has been described in which the angular velocity sensor 1 includes, for example, the movable part detection electrode 231a and the fixed part detection electrode 531a, and the movable part detection electrode 231b and the fixed part detection electrode 531b, and the signals of the fixed part detection electrodes 531a and 531b are differentially amplified. However, the angular velocity sensor 1 may include only either the movable part detection electrode 231a and the fixed part detection electrode 531a or the movable part detection electrode 231b and the fixed part detection electrode 531b. The same applies to the others of the movable part detection excitation electrodes 251a and 251b, the fixed part detection excitation electrodes 551a and 551b, and the like; and only either of them may be provided.

In each of the above embodiments, when the movable part 20 is caused to perform drive resonance and detection resonance, the amplitude of the detection resonance may be made equal to or larger than the amplitude of the drive resonance.

Figure 14A:
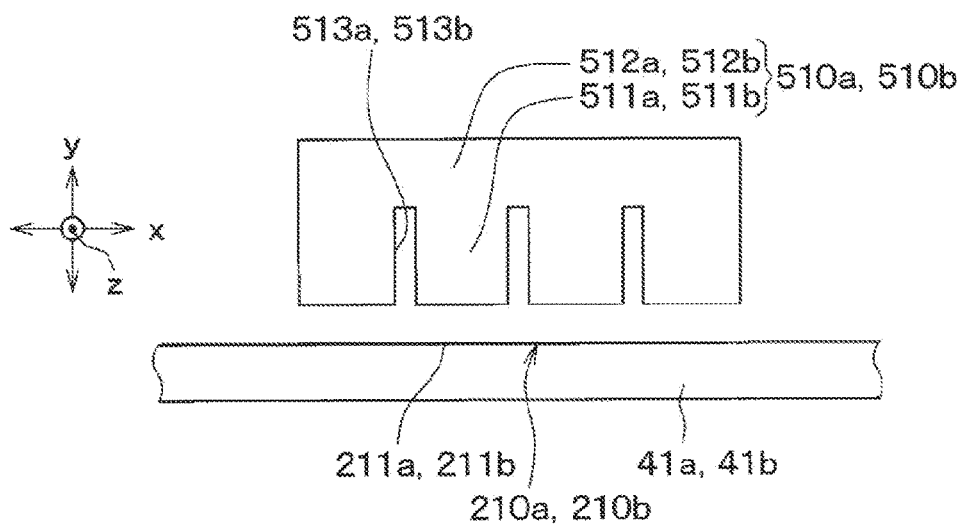
FIG. 14A is a plan view illustrating configurations of a movable part drive adjustment electrode and a fixed part drive adjustment electrode according to another embodiment.

Furthermore, in each of the above embodiments, the shapes of the movable part drive adjustment electrode parts 210a and 210b and the fixed part drive adjustment electrode parts 510a and 510b can be appropriately changed. For example, the fixed part drive adjustment electrode parts 510a and 510b may have a plurality of slits 513a and 513b formed from the plates 41a and 41b sides, as illustrated in FIG. 14A. According to this, damping can be reduced by the slits 513a and 513b. The fixed part drive adjustment electrode parts 510a and 510b are formed by, for example, performing deep reactive ion etching (DRIE) on the semiconductor layer 12. In this case, by forming the slits 513a and 513b, the fluidity of a gas, while the DRIE is being performed, can be improved, and processing accuracy can be improved. Therefore, a variation in detection accuracy can be suppressed, and detection accuracy can be improved.

Figure 14B:
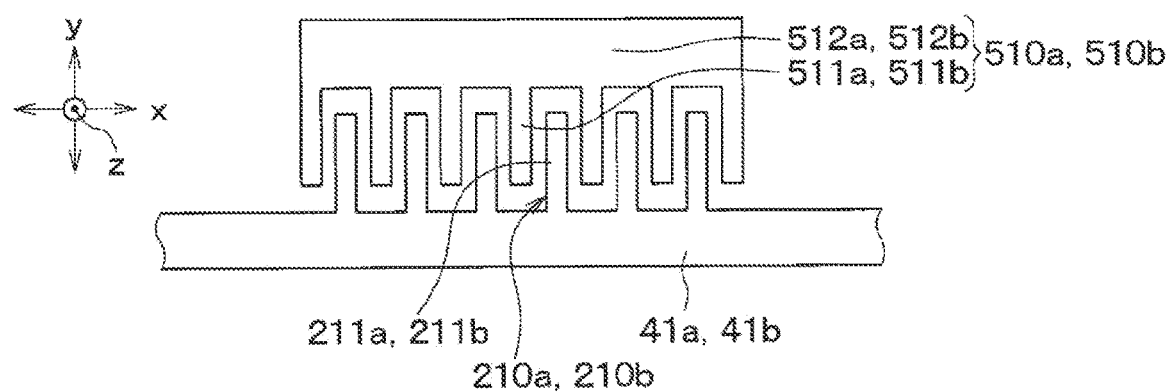
FIG. 14B is a plan view illustrating configurations of a movable part drive adjustment electrode and a fixed part drive adjustment electrode according to yet another embodiment.

In addition, the movable part drive adjustment electrode parts 210a and 210b may be configured to include comb-shaped movable part drive adjustment electrodes 211a and 211b protruding from the plates 41a and 41b along the y-axis direction, as illustrated in FIG. 14B. The fixed part drive adjustment electrode parts 510a and 510b may be configured to include comb-shaped fixed part drive adjustment electrodes 511a and 511b extended in the y-axis direction so as to mesh with the comb teeth of the movable part drive adjustment electrodes 211a and 211b, and support parts 512a and 512b that support the fixed part drive adjustment electrodes 511a and 511b. According to this, processing accuracy can be improved while damping is further reduced.

Figure 14C:
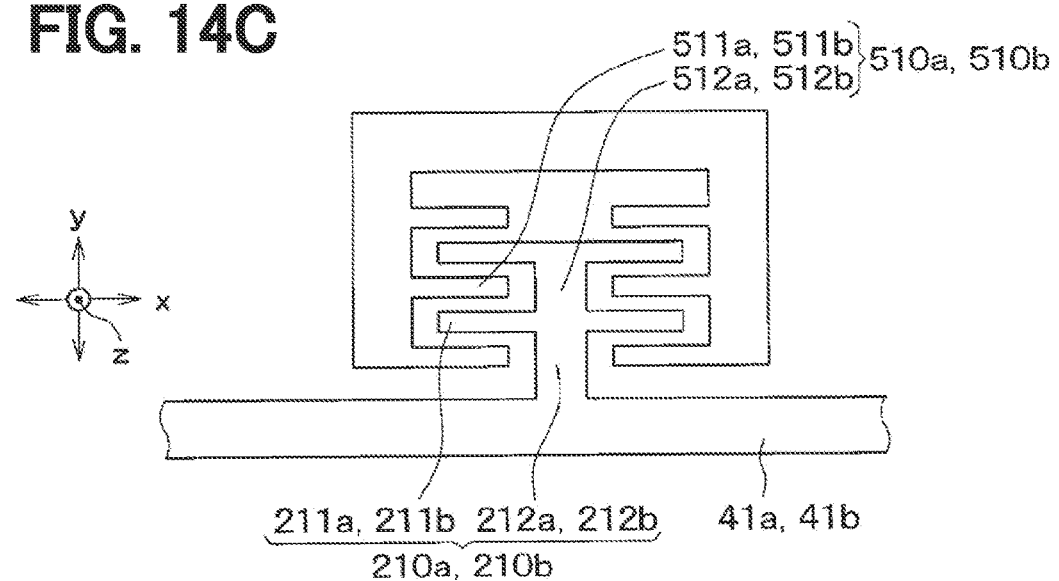
FIG. 14C is a plan view illustrating configurations of a movable part drive adjustment electrode and a fixed part drive adjustment electrode according to even yet another embodiment.

Furthermore, the movable part drive adjustment electrode parts 210a and 210b may be configured to include movable part drive adjustment electrodes 211a and 211b and support parts 212a and 212b that support the movable part drive adjustment electrodes 211a and 211b, as illustrated in FIG. 14C. Specifically, the support parts 212a and 212b are formed to protrude from the plates 41a and 41b along the y-axis direction. The movable part drive adjustment electrodes 211a and 211b are provided in the support parts 212a and 212b so as to be extended from the support parts 212a and 212b along the x-axis direction. In this case, the fixed part drive adjustment electrode parts 510a and 510b are configured to include comb-shaped fixed part drive adjustment electrodes 511a and 511b extended in the x-axis direction so as to mesh with the comb teeth of the movable part drive adjustment electrodes 211a and 211b, and the support parts 512a and 512b that support the fixed part drive adjustment electrodes 511a and 511b. According to this, the facing areas between the movable part drive adjustment electrodes 211a and 211b and the fixed part drive adjustment electrodes 511a and 511b can be easily increased. As a result, a desired electric spring effect can be generated even when the intervals between the movable part drive adjustment electrodes 211a and 211b and the fixed part drive adjustment electrodes 511a and 511b are increased. Therefore, even when the drive vibration is increased, the contact between the movable part drive adjustment electrodes 211a and 211b and the fixed part drive adjustment electrodes 511a and 511b can be suppressed, and sensitivity can be increased.

The above embodiments can be appropriately combined. For example, the arrangement relationships among the movable part detection electrodes 231a and 231b, the movable part detection excitation electrodes 251a and 251b, the fixed part detection electrodes 531a and 531b, and the fixed part detection excitation electrodes 551a and 551b may be changed by combining the second embodiment with the fifth to seventh embodiments. In addition, the mass part 30 may be configured to include the first mass part 301, the second mass part 302, and the link spring 303 by combining the third and fourth embodiments with the fifth to seventh embodiments. In addition, a configuration, in which the first FtR controller 740, the second FtR controller 750, and the like are included, may be created by combining the fifth and sixth embodiments with the seventh embodiment. Combinations of the above embodiments may be further combined with each other.

The control units and the methods thereof described in the present disclosure may be realized by a dedicated computer provided by configuring a processor and a memory programmed to execute one or more functions embodied by a computer program. Alternatively, the control units and the methods thereof described in the present disclosure may be realized by a dedicated computer provided by configuring a processor with one or more dedicated hardware logic circuits. Alternatively, the control units and the methods thereof described in the present disclosure may be realized by one or more dedicated computers configured by a combination of a processor and a memory, programmed to execute one or more functions, and a processor configured with one or more hardware logic circuits. In addition, the computer program may be stored in a computer-readable non-transition tangible recording medium as an instruction to be executed by the computer.

What is claimed is:

1. An angular velocity sensor system configured to detect an angular velocity, the angular velocity sensor system comprising:
    an angular velocity sensor; and
    a controller configured to execute predetermined processing, wherein:
    the angular velocity sensor includes
      a movable part including
        a drive spring,
        a detection spring,
        a mass part supported via the drive spring and the detection spring, configured to vibrate in a first direction by deformation of the drive spring, and configured to vibrate in a second direction orthogonal to the first direction by deformation of the detection spring due to a Coriolis force when an angular velocity is applied while vibrating in the first direction,
        a movable part drive electrode,
        a movable part detection electrode, and
        a movable part detection excitation electrode, and
      a fixed part including
        a fixed part drive electrode facing the movable part drive electrode,
        a fixed part detection electrode facing the movable part detection electrode, and
        a fixed part detection excitation electrode facing the movable part detection excitation electrode,
    the angular velocity sensor includes
      a drive spring adjustment part configured to change a spring constant of the drive spring, and
      a detection spring adjustment part configured to change a spring constant of the detection spring,
    the controller is configured to
      vibrate the movable part in the second direction by applying a predetermined voltage to the fixed part detection excitation electrode and simultaneously vibrate the movable part in the first direction by applying a predetermined voltage to the fixed part drive electrode,
      acquire a first resonance frequency of the movable part, which is in a direction along the first direction, and a second resonance frequency of the movable part, which is in a direction along the second direction,
      adjust the spring constant of the drive spring by controlling the drive spring adjustment part, such that the first resonance frequency is maintained at a constant value,
      adjust the spring constant of the detection spring by controlling the detection spring adjustment part, such that the second resonance frequency is maintained at a constant value, and
      detect the angular velocity on a basis of a result of synchronously detecting a signal from the fixed part detection electrode with the first resonance frequency,
    the movable part has, as the second resonance frequency, a detection resonance frequency and a non-detection resonance frequency, which is different from the detection resonance frequency and the first resonance frequency, and
    the controller is configured to
      acquire, as the second resonance frequency, the non-detection resonance frequency, and
      control the detection spring adjustment part to adjust the spring constant of the detection spring, such that the non-detection resonance frequency is maintained at a constant value.

2. The angular velocity sensor system according to claim 1, wherein
    the mass part includes
      a first mass part,
      a second mass part arrayed along the second direction, and a link spring coupling the first mass part with the second mass part and is configured to displace the first mass part and the second mass part along the second direction, the detection resonance frequency is a resonance frequency in an in-phase mode in which the first mass part and the second mass part vibrate in a same direction along the second direction, the non-detection resonance frequency is a resonance frequency in a reverse phase mode in which the first mass part and the second mass part vibrate in opposite directions along the second direction, and the movable part is configured to
be vibrated in the reverse phase mode when the angular velocity is not applied, and
be added with vibration in the in-phase mode when the angular velocity is applied.

3. The angular velocity sensor system according to claim 2, wherein
the detection spring and the link spring have a same cross-sectional shape in the first direction as a normal direction.

4. The angular velocity sensor system according to claim 1, wherein
the controller is configured to detect the angular velocity on a basis of a signal obtained by synchronously detecting the signal from the fixed part detection electrode with the first resonance frequency and then by cutting off a frequency component equal to or larger than an absolute value of a difference between the non-detection resonance frequency and the first resonance frequency.

5. The angular velocity sensor system according to claim 1, wherein
the drive spring adjustment part includes
a movable part drive adjustment electrode provided in the movable part, and
a fixed part drive adjustment electrode, which faces the movable part drive adjustment electrode,
the detection spring adjustment part includes
a movable part detection adjustment electrode provided in the movable part, and
a fixed part detection adjustment electrode, which faces the movable part detection adjustment electrode, and
the controller is configured to
adjust the spring constant of the drive spring by adjusting a potential difference between the movable part drive adjustment electrode and the fixed part drive adjustment electrode, and
adjust the spring constant of the detection spring by adjusting a potential difference between the movable part detection adjustment electrode and the fixed part detection adjustment electrode.

6. The angular velocity sensor system according to claim 5, wherein
the controller is configured to
apply an offset voltage to the fixed part drive adjustment electrode, such that the first resonance frequency is smaller than a design value specified by a structure of the movable part, and
apply an offset voltage to the fixed part detection adjustment electrode, such that the second resonance frequency is smaller than a design value specified by the structure of the movable part.

7. The angular velocity sensor system according to claim 1, wherein the controller is configured to make an amplitude in the first direction larger than an amplitude in the second direction when vibrating the movable part simultaneously in the first and second directions.

8. The angular velocity sensor system according to claim 1, wherein
the movable part detection electrode and the movable part detection excitation electrode are placed on opposite sides across the mass part.

9. The angular velocity sensor system according to claim 1, wherein
the controller includes an FtR controller configured to
generate a voltage to cancel a Coriolis force, which is generated when the angular velocity is applied, by using the signal that has been synchronously detected,
detect the angular velocity on a basis of the voltage, and
reduce vibration of the movable part in the second direction by using the voltage.

10. The angular velocity sensor system according to claim 9, further comprising:
a movable part FtR electrode provided in the movable part; and
a fixed part FtR electrode facing the movable part FtR electrode, wherein
the controller is configured to reduce vibration of the movable part in the second direction by adjusting, with the voltage, a potential difference between the movable part FtR electrode and the fixed part FtR electrode.

11. An angular velocity sensor system configured to detect an angular velocity, the angular velocity sensor system comprising
an angular velocity sensor; and
a controller configured to execute predetermined processing, wherein:
the angular velocity sensor includes
a movable part including
a drive spring,
a detection spring,
a mass part supported via the drive spring and the detection spring, configured to vibrate in a first direction by deformation of the drive spring, and configured to vibrate in a second direction orthogonal to the first direction by deformation of the detection spring due to a Coriolis force when an angular velocity is applied while vibrating in the first direction,
a movable part drive electrode,
a movable part detection electrode, and
a movable part detection excitation electrode, and
a fixed part including
a fixed part drive electrode facing the movable part drive electrode,
a fixed part detection electrode facing the movable part detection electrode, and
a fixed part detection excitation electrode facing the movable part detection excitation electrode,
the angular velocity sensor includes
a drive spring adjustment part configured to change a spring constant of the drive spring, and
a detection spring adjustment part configured to change a spring constant of the detection spring, and
the controller is configured to
vibrate the movable part in the second direction by applying a predetermined voltage to the fixed part detection excitation electrode and simultaneously vibrate the movable part in the first direction by applying a predetermined voltage to the fixed part drive electrode, acquire a first resonance frequency of the movable part, which is in a direction along the first direction, and a second resonance frequency of the movable part, which is in a direction along the second direction, adjust the spring constant of the drive spring by controlling the drive spring adjustment part, such that the first resonance frequency is maintained at a constant value, adjust the spring constant of the detection spring by controlling the detection spring adjustment part, such that the second resonance frequency is maintained at a constant value, and detect the angular velocity on a basis of a result of synchronously detecting a signal from the fixed part detection electrode with the first resonance frequency, the movable part has, as the second resonance frequency, a detection resonance frequency and a non-detection resonance frequency, which is different from the detection resonance frequency and the first resonance frequency, and the controller is configured to acquire, as the second resonance frequency, the non-detection resonance frequency, estimate the detection resonance frequency from the non-detection resonance frequency, and adjust the spring constant of the detection spring by controlling the detection spring adjustment part, such that the estimated detection resonance frequency is maintained at the constant value.

12. An angular velocity sensor configured to detect an angular velocity, the angular velocity sensor comprising:

a movable part including a drive spring, a detection spring, a mass part, which is supported via the drive spring and the detection spring, configured to vibrate in a first direction by deformation of the drive spring, and configured to vibrate in a second direction orthogonal to the first direction by deformation of the detection spring due to a Coriolis force when an angular velocity is applied while vibrating in the first direction, a movable part drive electrode, a movable part detection electrode, and a movable part detection excitation electrode; and a fixed part including a fixed part drive electrode facing the movable part drive electrode, a fixed part detection electrode facing the movable part detection electrode, and a fixed part detection excitation electrode facing the movable part detection excitation electrode;

a drive spring adjustment part configured to change a spring constant of the drive spring; and a detection spring adjustment part configured to change a spring constant of the detection spring, wherein:

the movable part is configured to vibrate in the second direction when a predetermined voltage is applied to the fixed part detection excitation electrode and simultaneously vibrate in the first direction when a predetermined voltage is applied to the fixed part drive electrode, the spring constant of the drive spring is configured to be adjusted by controlling the drive spring adjustment part, such that a first resonance frequency of the movable part in a direction along the first direction is maintained at a constant value, the spring constant of the detection spring is configured to be adjusted by controlling the detection spring adjustment part, such that a second resonance frequency of the movable part in a direction along the second direction is maintained at a constant value, the angular velocity is configured to be detected on a basis of a signal from the fixed part detection electrode, the mass part includes a first mass part, a second mass part arrayed along the second direction, and a link spring coupling the first mass part with the second mass part and configured to displace the first mass part and the second mass part along the second direction, the movable part has, as the second resonance frequency, a detection resonance frequency in an in-phase mode, in which the first mass part and the second mass part vibrate in a same direction along the second direction, and a non-detection resonance frequency in a reverse phase mode, in which the first mass part and the second mass part vibrate in opposite directions along the second direction, and the spring constant of the detection spring is configured to be adjusted by controlling the detection spring adjustment part, such that, as the second resonance frequency, the detection resonance frequency or the non-detection resonance frequency is maintained at a constant value.

13. The angular velocity sensor according to claim 12, wherein the detection spring and the link spring have a same cross-sectional shape in the first direction as a normal direction.

* * * * *